(12) United States Patent
Son et al.

(10) Patent No.: US 11,934,599 B2
(45) Date of Patent: Mar. 19, 2024

(54) DISPLAY DEVICE

(71) Applicant: SAMSUNG DISPLAY CO., LTD., Yongin-si (KR)

(72) Inventors: Jungha Son, Yongin-si (KR); Jaeik Lim, Hwaseong-si (KR); Gee-Bum Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 155 days.

(21) Appl. No.: 17/298,791

(22) PCT Filed: Sep. 23, 2019

(86) PCT No.: PCT/KR2019/012330
§ 371 (c)(1),
(2) Date: Dec. 27, 2021

(87) PCT Pub. No.: WO2020/122378
PCT Pub. Date: Jun. 18, 2020

(65) Prior Publication Data
US 2022/0121301 A1    Apr. 21, 2022

(30) Foreign Application Priority Data

Dec. 10, 2018    (KR) .................... 10-2018-0158361

(51) Int. Cl.
G06F 3/041    (2006.01)
G06F 3/044    (2006.01)
H10K 59/40    (2023.01)

(52) U.S. Cl.
CPC .......... *G06F 3/0412* (2013.01); *G06F 3/0443* (2019.05); *H10K 59/40* (2023.02);
(Continued)

(58) Field of Classification Search
CPC ........ G09G 3/0412; G06F 3/044–0448; H10K 59/40; H10K 59/12; H10K 50/86;
(Continued)

(56) References Cited

U.S. PATENT DOCUMENTS 10,032,837 B2    7/2018  Ma
10,079,365 B2    9/2018  Kim et al.
(Continued)

FOREIGN PATENT DOCUMENTS

JP    2009-110873    5/2009
JP    2013-178543    9/2013
(Continued)

*Primary Examiner* — Sanjiv D. Patel
(74) *Attorney, Agent, or Firm* — F. CHAU & ASSOCIATES, LLC

(57) ABSTRACT

A display device may include a display panel including a pixel region and an input sensor, wherein the input sensor includes a first conductive layer disposed on the display panel. A first insulation layer is disposed on the first conductive layer and has a first opening in a first region overlapping the pixel region, a second conductive layer is disposed on the first insulation layer. A second insulation layer is disposed on the second conductive layer and has a second opening defined in a second region overlapping the pixel region. A third insulation layer is disposed on the second insulation layer and is filled in the first opening and the second opening.

20 Claims, 21 Drawing Sheets

(52) U.S. Cl.
CPC .. *G06F 3/0446* (2019.05); *G06F 2203/04111* (2013.01); *G06F 2203/04112* (2013.01)

(58) Field of Classification Search
CPC ............... H10K 59/122; H10K 50/844; H10K 50/8445; G02B 1/11
See application file for complete search history.

(56) References Cited

U.S. PATENT DOCUMENTS

| | | | |
|---|---|---|---|
| 10,312,299 | B2 | 6/2019 | Jun et al. |
| 10,338,449 | B2 | 7/2019 | Kang et al. |
| 10,566,502 | B2 | 2/2020 | Hwang et al. |
| 10,572,080 | B2 | 2/2020 | Lee et al. |
| 2016/0087245 | A1* | 3/2016 | Park .................. H10K 50/858 257/40 |
| 2017/0278900 | A1* | 9/2017 | Yang .................. H10K 50/86 |
| 2018/0033831 | A1* | 2/2018 | An .................... H10K 50/84 |
| 2018/0033980 | A1* | 2/2018 | Park .................. G06F 3/0412 |
| 2018/0138458 | A1* | 5/2018 | Tokuda .............. H10K 50/844 |

FOREIGN PATENT DOCUMENTS

| | | |
|---|---|---|
| JP | 2018-041565 | 3/2018 |
| KR | 10-2016-0149363 | 12/2016 |
| KR | 10-2017-0026949 | 3/2017 |
| KR | 10-2017-0141115 | 12/2017 |
| KR | 10-2018-0005327 | 1/2018 |
| KR | 10-2018-0014397 | 2/2018 |
| KR | 10-2018-0059010 | 6/2018 |

\* cited by examiner

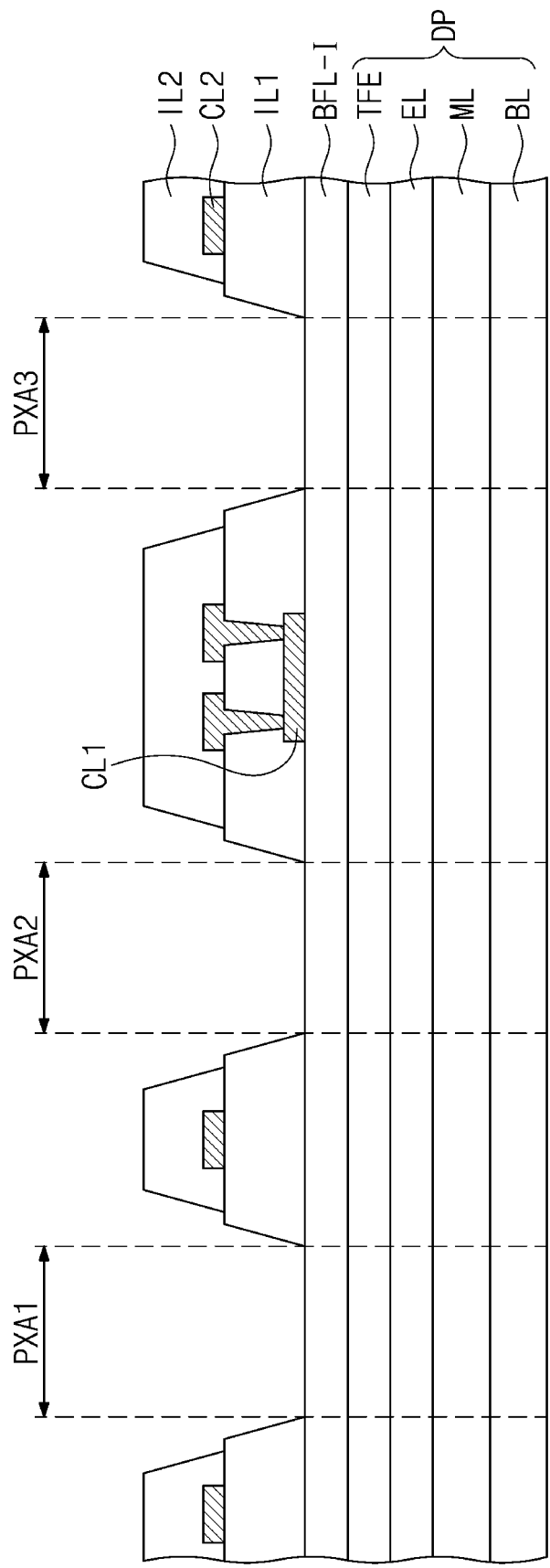

DISPLAY DEVICE

CROSS-REFERENCE TO RELATED APPLICATIONS

This application is a National Stage application of PCT/KR2019/012330 filed Sep. 23, 2019, which in turns claims priority from Korean Application No. 10-2018-0158361 filed Dec. 10, 2018, the contents of which are incorporated by reference herein in their entirety.

TECHNICAL FIELD

The present disclosure relates to a display device, and more particularly, to a display device having enhanced light efficiency.

DESCRIPTION OF THE RELATED ART

A display device may be categorized into a self-emitting type display device in which a light emitting element emits light by itself or a light-receiving type display device which controls the transmittance of received light. The self-emitting type display device may be, for example, an organic light emitting display device. Light generated in a light emitting layer of the organic light emitting display device may be emitted not only in the front direction but also in the lateral direction. Light efficiency may be determined on the basis of a light emitted in the front direction. That is, a light emitted in the lateral direction may cause a decrease in the light efficiency.

DISCLOSURE OF THE INVENTION

The present disclosure provides a display device with improved light efficiency.

A display device according to an embodiment of the present disclosure may include a display panel having a pixel region, and an input sensor disposed on the display panel, wherein the input sensor may include a first conductive layer disposed on the display panel, a first insulation layer disposed on the first conductive layer and having a first opening in a first region overlapping the pixel region, a second conductive layer disposed on the first insulation layer, a second insulation layer disposed on the second conductive layer and having a second opening defined in a second region overlapping the pixel region, and a third insulation layer disposed on the second insulation layer and filled in the first opening and the second opening.

The first insulation layer may have a first refractive index, the second insulation layer may have a second refractive index, and the third insulation layer may have a third refractive index which is higher than the first refractive index and the second refractive index.

On a plane, an area of the first opening may be smaller than an area of the second opening.

On a plane, an area of the first opening may be the same or larger than an area of the pixel region.

On a plane, a side surface of the first insulation layer defining the first opening may be surrounded by a side surface of the second insulation layer defining the second opening.

The first conductive layer may include a connecting part and the second conductive layer may include sensor parts.

Each of the sensor parts may have a mesh shape, each of the sensor parts may have a sensor opening defined on a plane, and the sensor opening may overlap the first opening and the second opening.

The first refractive index and the second refractive index may each be about 1.45 to about 1.55, and the third refractive index may be about 1.60 to about 1.70.

The display panel may include a base layer, a circuit layer disposed on the base layer, a light emitting layer disposed on the circuit layer, and an encapsulation layer disposed on the light emitting layer, and the input sensor may be disposed in direct contact with the encapsulation layer.

The input sensor may further include a buffer layer which is in direct contact with the encapsulation layer, and the buffer layer may be disposed between the encapsulation layer and the first conductive layer.

A display device according to an embodiment of the present disclosure may include a display panel including a pixel region, a first insulation layer disposed on the display panel, having a first refractive index, and having a first opening defined in a region overlapping the pixel region, a second insulation layer disposed on the first insulation layer, having a second refractive index, and having a second opening larger than the first opening in a region corresponding to the first opening, and a third insulation layer covering the display panel, the first insulation layer, and the second insulation layer and having a third refractive index higher than the first refractive index and the second refractive index, and the third insulation layer may overlap the pixel region on a plane.

A first conductive layer disposed between the display panel and the first insulation layer, and a second conductive layer disposed between the first insulation layer and the second insulation layer may further be included.

A fourth insulation layer disposed between the first insulation layer and the second conductive layer and having a refractive index lower than the third refractive index may further be included, wherein a third opening larger than the first opening and smaller than the second opening may be defined in the fourth insulation layer.

The first conductive layer may include a connecting part and the second conductive layer may include sensor parts.

Each of the sensor parts may have a mesh shape, and the sensor parts may not overlap the pixel region on a plane.

Each of the sensor parts may have a mesh shape, each of the sensor parts may have a sensor opening defined on a plane, and the sensor opening may overlap the first opening and the second opening.

A fourth insulation layer disposed between the second insulation layer and the third insulation layer and having a refractive index lower than the third refractive index may further be included, wherein a third opening larger than the second opening may be defined in the fourth insulation layer.

On a plane, a side surface of the first insulation layer defining the first opening may be surrounded by a side surface of the second insulation layer defining the second opening.

The first refractive index and the second refractive index may each be about 1.45 to about 1.55, and the third refractive index may be about 1.60 to about 1.70.

The third insulation layer may be filled in each of the first opening and the second opening.

Advantageous Effects

According to an embodiment of the present disclosure, a display device includes a first insulation layer having a first refractive index and a first opening defined in a region overlapping a pixel region, a second insulation layer having a second opening defined in a region overlapping the pixel region, and a third insulation layer filled in the first opening and the second opening. The refractive index of the third insulation layer may be higher than the refractive indexes of the first insulation layer and the second insulation layer. A light emitted from a light emitting element of the display device may be refracted or totally reflected at the boundary between a low refractive later and a high refractive layer, and thus, may have a changed light path. The light emitting efficiency of the display device may be improved by the changed light path. In addition, the first opening and the second opening are defined in different insulation layers. Therefore, even when the distance between sidewall portions defining each of the first and second opening and a display region is reduced, the probability of a phenomenon occurring, the phenomenon in which the third insulation layer is not filled in each of the first and second openings, may be reduced.

BRIEF DESCRIPTION OF THE DRAWINGS

FIG. 13A to FIG. 13G are cross-sectional views illustrating a method for manufacturing a display device according to an embodiment of the present disclosure.

DETAILED DESCRIPTION

Figure 1:
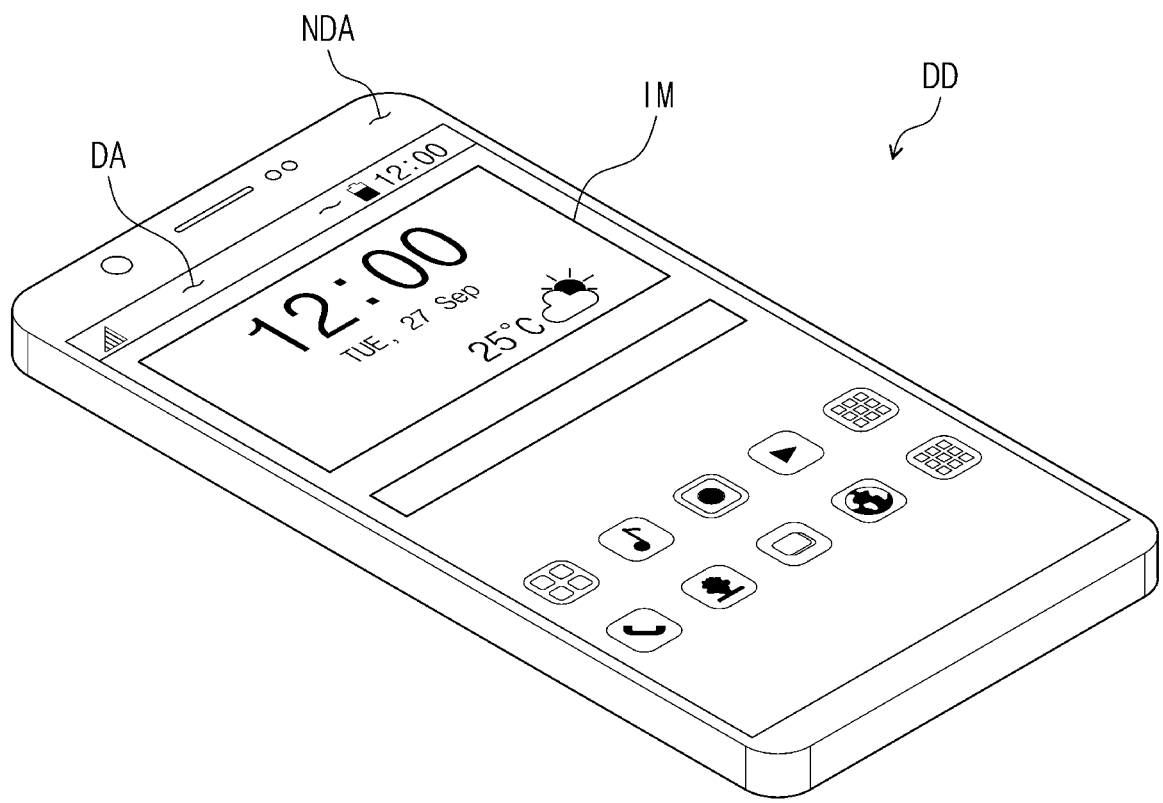
FIG. 1 is a perspective view of a display device according to an embodiment of the present disclosure.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated components may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings. The term "filled" means partly filled or fully filled.

Unless otherwise defined, all terms (including technical and scientific terms) used herein have the same meaning as commonly understood by those skilled in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, exemplary embodiments of the present disclosure will be described with reference to the accompanying drawings.

FIG. 1 is a perspective view of a display device according to an embodiment of the present disclosure.

Referring to FIG. 1, a display device DD may be used in large electronic devices such as televisions, monitors, or external advertisement boards, and also in small and medium-sized electronic devices such as personal computers, notebook computers, personal digital terminals, car navigation system units, game machines, portable electronic apparatuses, and cameras. It should be understood that these are merely illustrative embodiments provided for explanatory purposes, and the display device DD may be employed in other types of electronic devices without departing from the present disclosure.

The display device DD may have a display region DA and a non-display region NDA.

The display region DA on which an image IM is displayed is substantially parallel to a surface defined by a first direction DR1 and a second direction DR2. The normal direction of the display region DA, that is, the thickness direction of the display device DD is indicated by a third direction DR3. A front surface (or an upper surface) and a back surface (or a lower surface) of each member are distinguished by the third direction DR3. However, directions indicated by the first to third directions DR1, DR2, and DR3 are a relative concept, and may be converted to different directions. Hereinafter, first to third directions are directions indicated by the first to third directions DR1, DR2, and DR3, respectively, and are given the same reference numerals.

The non-display region NDA is a region adjacent to the display region DA, and is a region in which the image IM is not displayed. A bezel region of the display device DD may be defined by the non-display region NDA.

The non-display region NDA may surround all or a part of the display region DA. However, the embodiment of the present disclosure is not limited thereto. The shape of the display region DA and the shape of the non-display region NDA may be correlatively designed.

FIG. 2A FIG. 2B, FIG. 2C, and FIG. 2D are cross-sectional views of the display device DD according to an embodiment of the present disclosure. FIG. 2A to FIG. 2D illustrate cross-sections defined by the second direction DR2 and the third direction DR3. FIG. 2A to FIG. 2D are simply illustrated to describe the stacking relationship of functional members constituting the display device DD.

The display device DD according to an embodiment of the present disclosure may include a display panel, an input sensor, an anti-reflector, and a window. At least some components among the display panel, the input sensor, the anti-reflector, and the window may be provided in a continuous process, or at least some components thereof may be bonded to each other through an adhesive member. In FIG. 2A to FIG. 2D, an optically clear adhesive (OCA) member is exemplarily illustrated as the adhesive member. The adhesive member described hereinafter may include a typical adhesive or pressure-sensitive adhesive. In an embodiment of the present disclosure, the anti-reflector and the window may be replaced by other components, or may be omitted.

In FIG. 2A to FIG. 2D, among the input sensor, the anti-reflector, and the window, a corresponding component provided through a continuous process with another component is represented as a "layer." Among the input sensor, the anti-reflector, and the window, a component bonded to another component though an adhesive member is represented as a "panel." The panel includes a base layer which provides a base surface, for example, a synthetic resin film, a composite film, a glass substrate, and the like, but the "layer," may not include the base layer. In other words, the units represented as a "layer" are disposed on the base surface provided by another unit.

Hereinafter, depending on the presence of a base layer, the input sensor, the anti-reflector, and the window may be referred to as an input sensing panel ISP, an anti-reflection panel RPP, and a window panel WP, or an input sensing layer ISL, an anti-reflection layer RPL, and a window layer WL.

Figure 2A:
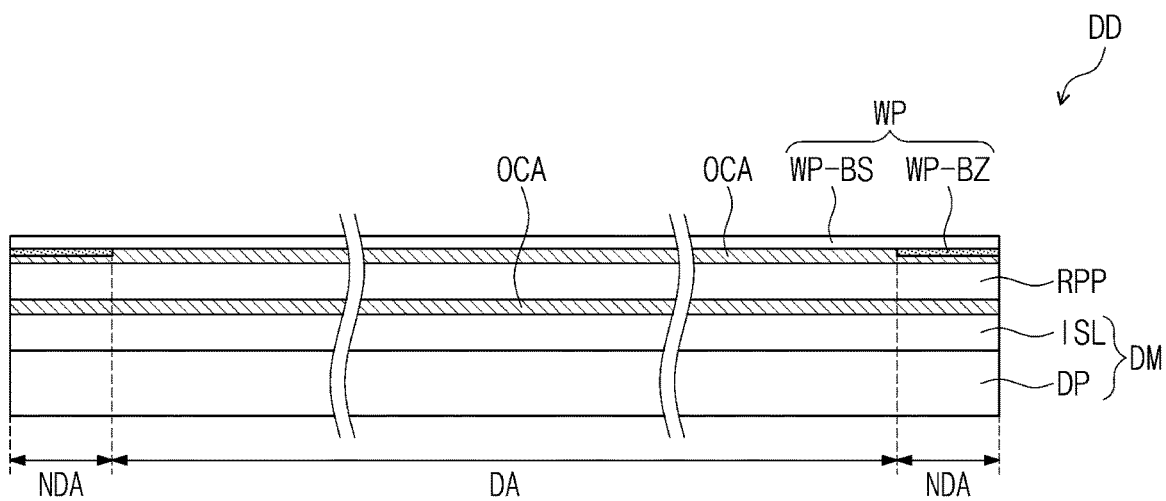
FIG. 2A, FIG. 2B, FIG. 2C and FIG. 2D are cross-sectional views of a display device according to an embodiment of the present disclosure.

As illustrated in FIG. 2A, the display device DD may include a display panel DP, the input sensing layer ISL, the anti-reflection panel RPP, and the window panel WP. The input sensing layer ISL is directly disposed on the display panel DP. In the present disclosure, "a component B is directly disposed on a component A" means that no separate adhesive layer/adhesive member is disposed between the component A and the component B. After the component A is provided, the component B may be provided on a base surface provided by the component A through a continuous process.

A display module DM may be defined by including the display panel DP and the input sensing layer ISL disposed directly on the display panel DP. Between the display module DM and the anti-reflection panel RPP and between the anti-reflection panel RPP and the window panel WP, the optically clear adhesive (OCA) member is disposed.

The display panel DP generates an image and the input sensing layer ISL obtains the coordinate information of an external input (for example, a touch event). Although not separately illustrated, the display module DM according to an embodiment of the present disclosure may further include a protective member disposed on a lower surface of the display panel DP. The protective member and the display panel DP may be bonded through an adhesive member. Display devices DD of FIG. 2B to FIG. 2D to be described hereinafter may also further include a protective member.

The display panel DP according to an embodiment of the present disclosure may be a light emitting type display panel, but is not particularly limited thereto. For example, the display panel DP may be an organic light emitting display panel or a quantum dot light emitting display panel. A light emitting layer of an organic light emitting display panel may include an organic light emitting material. A light emitting layer of a quantum dot light emitting display panel may include a quantum dot, a quantum rod, and the like. Hereinafter, the display panel DP will be described as being an organic light emitting display panel.

The anti-reflection panel RPP reduces the reflectance of an external light incident from an upper side of the window panel WP. The anti-reflection panel RPP according to an embodiment of the present disclosure may include a phase retarder and a polarizer. The phase retarder may be of a film type or a liquid crystal coating type, and may include a $\lambda/2$ phase retarder and/or a $\lambda/4$ phase retarder. The polarizer may also be of a film type or a liquid crystal coating type. The film type polarizer may include a stretchable synthetic resin film, and the liquid crystal coating type polarizer may include liquid crystals arranged in a predetermined arrangement. The phase retarder and the polarizer may further include a protective film. The phase retarder and the polarizer themselves or the protective film may be defined as a base layer of the anti-reflection panel RPP.

The anti-reflection panel RPP according to an embodiment of the present disclosure may include color filters. The color filters have a predetermined arrangement. The arrangement of the color filters may be determined in consideration of light emitting colors of pixels included in the display panel DP. The anti-reflection panel RPP may further include a black matrix adjacent to the color filters.

The anti-reflection panel RPP according to an embodiment of the present disclosure may include a destructive interference structure. For example, the destructive interference structure may include a first reflective layer and a second reflective layer disposed on different layers. A first reflective light and a second reflective light respectively reflected from the first reflective layer and the second reflective layer may be destructively interfered, and accordingly, the reflectance of the external light is reduced.

The window panel WP according to an embodiment of the present disclosure includes a base layer WP-BS and a light blocking pattern WP-BZ. The base layer WP-BS may include a glass substrate and/or a synthetic resin film, and the like. The base layer WP-BS is not limited to a single layer. The base layer WP-BS may include two or more films bonded with an adhesive member.

The light blocking pattern WP-BZ partially overlaps the base layer WP-BS. The light blocking pattern WP-BZ is disposed on the back surface of the base layer WP-BS, and the light blocking pattern WP-BZ may substantially define the non-display region NDA of the display device DD. A region in which the light blocking pattern WP-VZ is not disposed may define the display region DA of the display device DD. When limited to the window panel WP, a region in which the light blocking pattern WP-BZ is disposed is defined as a light blocking region of the window panel WP, and a region in which the light blocking pattern WP-BZ is not disposed is defined as a transmissive region of the window panel WP.

Figure 2B:
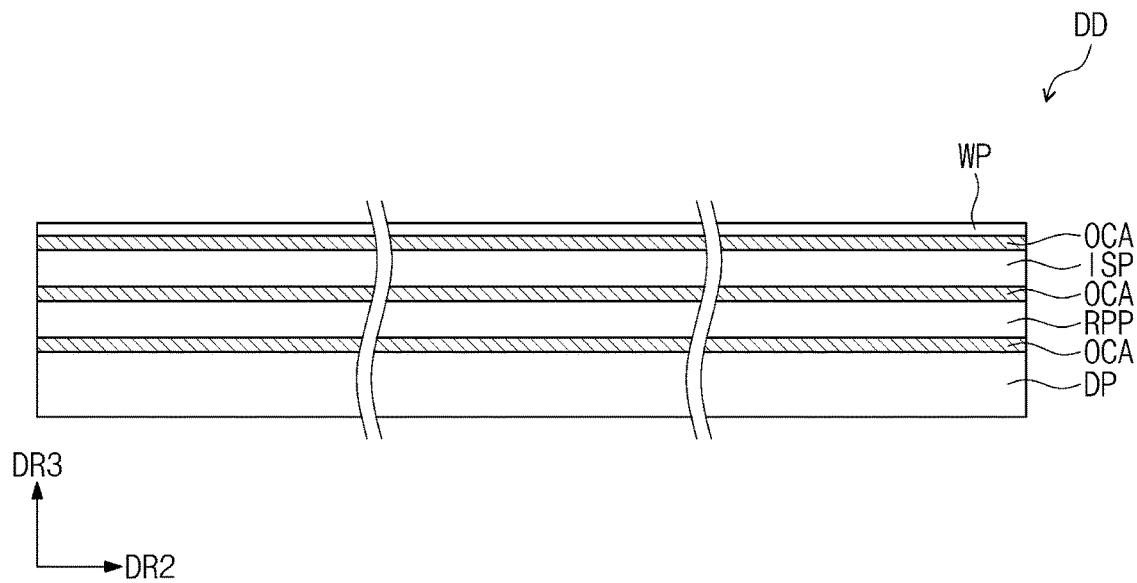
Figure 2C:
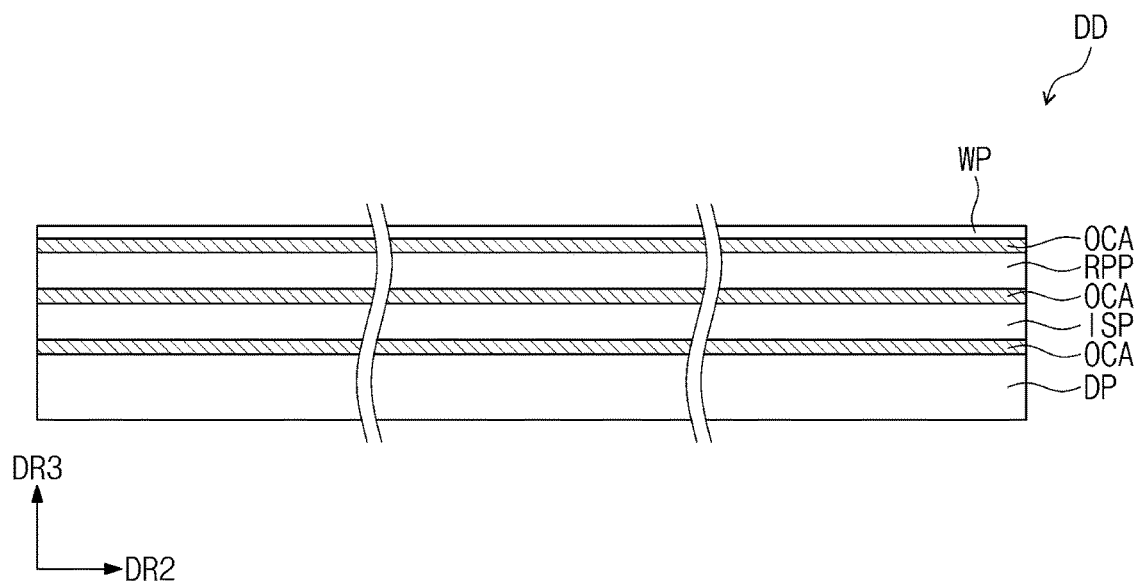
Figure 2D:
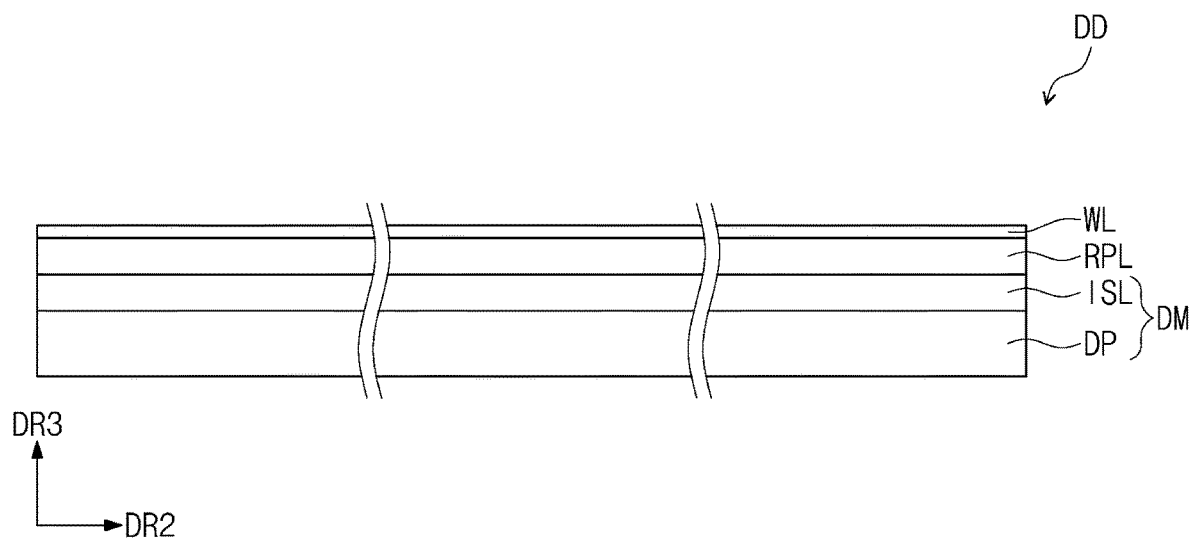

The light blocking pattern WP-BZ may have a multi-layered structure. The multi-layered structure may include a color layer of colors and a light blocking layer of a black color. The color layer of colors and the light blocking layer of a black color may be provided by deposition, printing, coating processes. Although not separately illustrated, the window panel WP may further include a functional coating layer disposed on the front surface of the base layer WP-BS. The functional coating layer may include an anti-fingerprint layer, an anti-reflection layer, a hard coating layer, and the like. In FIG. 2B to FIG. 2D to be referred to hereinafter, the window panel WP and the window layer WL are simply illustrated without the distinction of the base layer WP-BS and light blocking pattern WP-BZ.

As illustrated in FIG. 2B and FIG. 2C, the display device DD may include the display panel DP, the input sensing panel ISP, the anti-reflection panel RPP, and the window panel WP. The stacking order of the input sensing panel ISP and the anti-reflection panel RPP is subject to change.

As illustrated in FIG. 2D, the display device DD may include the display panel DP, the input sensing layer ISL, the anti-reflection layer RPL, and the window layer WL. Compared to the display device DD illustrated in FIG. 2A, the optical transparent adhesive members OCA are omitted, and on a base surface provided to the display panel DP, the input sensing layer ISL, the anti-reflection layer RPL, and the window layer WL are provided in a continuous process. The stacking order of the input sensing layer ISL and the anti-reflection layer RPL is subject to change.

Figure 3:
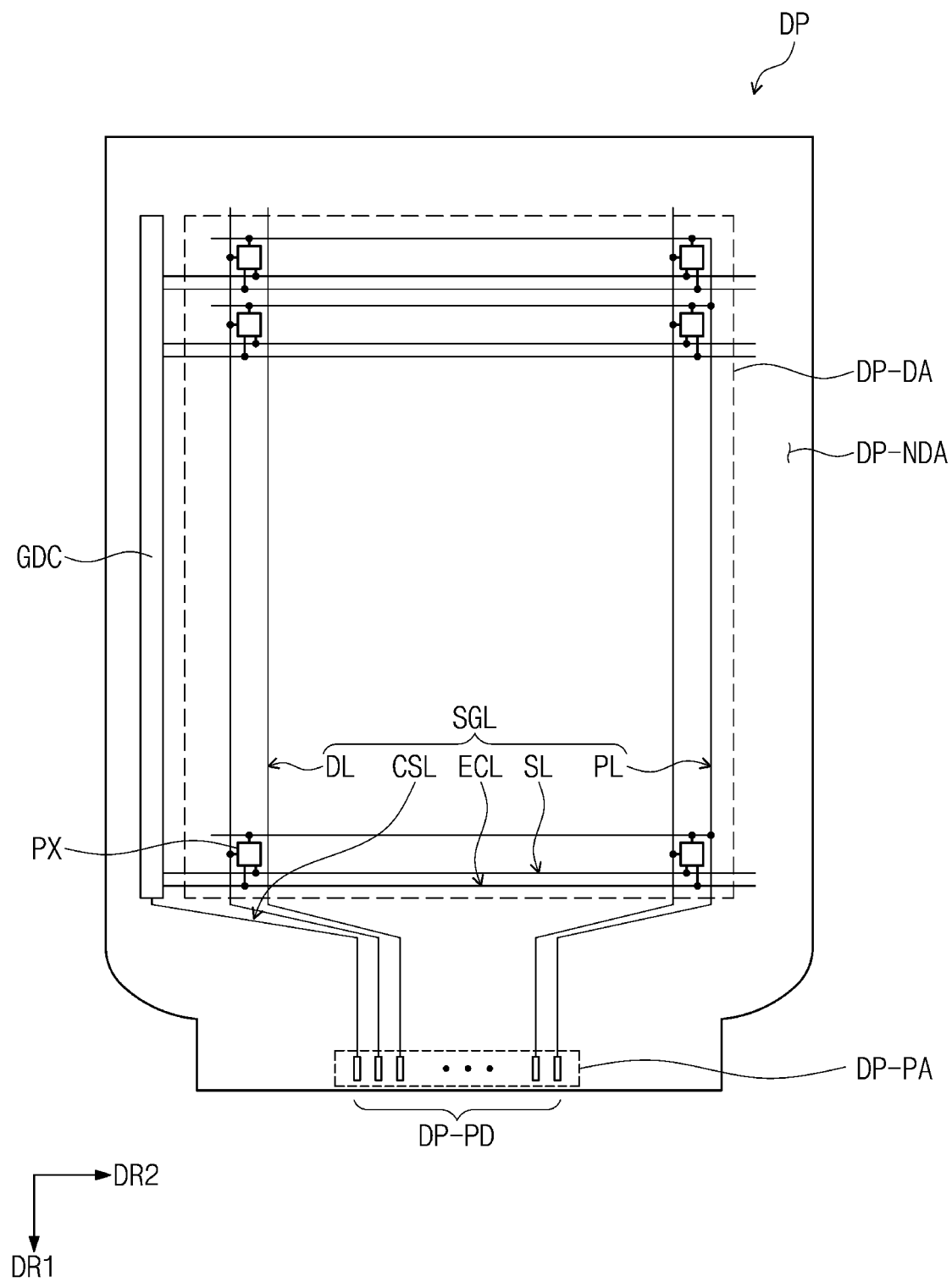
FIG. 3 is a plane view of a display panel according to an embodiment of the present disclosure.

FIG. 3 is a plane view of a display panel according to an embodiment of the present disclosure.

Referring to FIG. 3, the display panel DP may include a driving circuit GDC, a plurality of signal lines SGL (hereinafter, signal lines), a plurality of signal pads DP-PD (hereinafter, signal pads), and a plurality of pixels PX (hereinafter, pixels).

The display region DP-DA may be defined as a region in which the pixels PX are disposed. Each of the pixels PX includes an organic light emitting diode and a pixel driving circuit connected thereto. The driving circuit GDC, the signal lines SGL, the signal pads DP-PD, and the pixel driving circuit may be included in a circuit layer ML illustrated in FIG. 5.

The driving circuit GDC may include a scan driving circuit. The scan driving circuit generates a plurality of scan signals (hereinafter, scan signals), and sequentially outputs the scan signals to a plurality of scan lines SL (hereinafter, scan lines) to be described later. The scan driving circuit may further output another control signal to a driving circuit of the pixels PX.

The scan driving circuit may include a plurality of thin film transistors provided through the same process of the driving circuit of the pixels PX, for example, a Low Temperature Polycrystalline Silicon (LTPS) process or a Low Temperature Polycrystalline Oxide (LTPO) process.

The signal lines SGL include the scan lines SL, data lines DL, a power line PL, light emission control lines ECL, and a control signal line CSL.

Each of the scan lines SL is connected to a corresponding pixel PX among the pixels PX, and each of the data lines DL is connected to a corresponding pixel PX among the pixels PX. The power line PL is connected to the pixels PX. Each of the light emission control lines ECL is connected to a corresponding pixel PX among the pixels PX. The control signal line CSL may provide control signals to the scan driving circuit.

The signal lines SGL overlap the display region DP-DA and the non-display region DP-NDA. The signal lines SGL may include a pad unit and a line unit. The line unit overlaps the display region DP-DA and the non-display region DP-NDA. The pad unit is disposed at an end of the line unit. The pad unit is disposed in the non-display region DP-NDA and overlaps a corresponding signal pad among the signal pads DP-PD. In the non-display region DP-NDA, a region in which the signal pads DP-PD are disposed may be defined as a pad region DP-PA. To the pad region DP-PA, a circuit substrate not shown may be connected.

Figure 4:
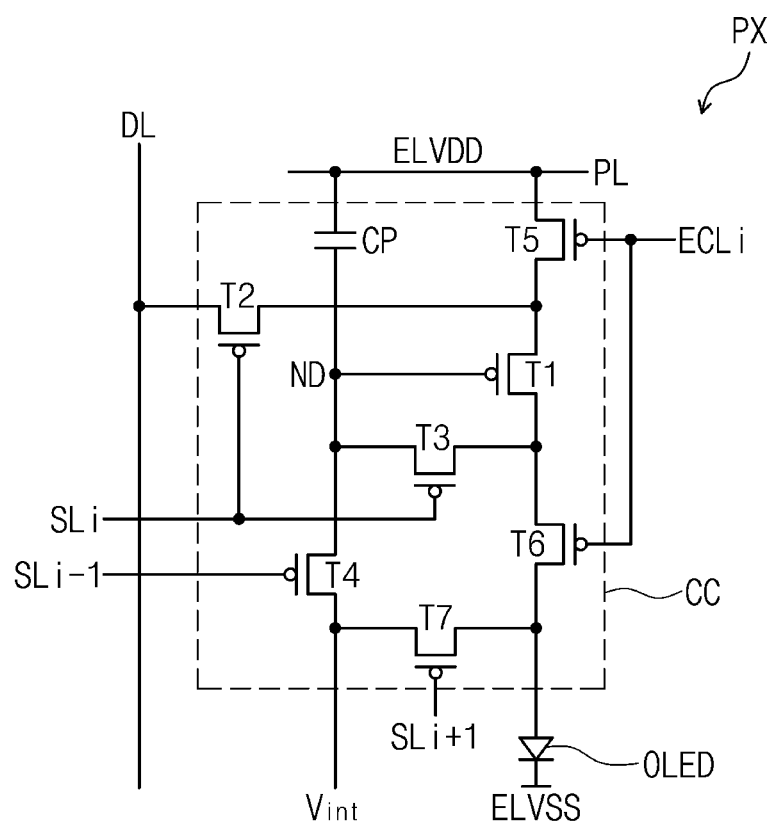
FIG. 4 is an equivalent circuit diagram of a pixel according to an embodiment of the present disclosure.

FIG. 4 is an equivalent circuit diagram of the pixel PX according to an embodiment of the present disclosure. FIG. 4 exemplarily illustrates the pixel PX connected to an i-th scan line SLi and an i-th light emission control line ECLi.

The pixel PX may include an organic light emitting diode OLED and a pixel circuit CC. The pixel circuit CC may include a plurality of transistors T1 to T7 and a capacitor CP. The pixel circuit CC controls the amount of current flowing in the organic light emitting diode OLED in correspondence to a data signal.

The organic light emitting diode OLED may emit light to a predetermined luminance in correspondence to the amount of current provided from the pixel circuit CC. To this end, the level of a first power ELVDD may be set to be higher than the level of a second power ELVSS.

Each of the plurality of transistors T1 to T7 may each include an input electrode (or a source electrode), an output electrode (or a drain electrode), and a control electrode (or a gate electrode). In the present disclosure, any one of the input electrode and the output electrode may be referred to as a first electrode, and the other one thereof may be referred to as a second electrode for convenience.

A first electrode of a first transistor T1 is connected to the first power ELVDD via a fifth transistor T5, and a second electrode of the first transistor T1 is connected to an anode electrode of the organic light emitting diode OLED via a sixth transistor T6. The first transistor T1 may be referred to as a driving transistor in the present disclosure.

The first transistor T1 controls the amount of current flowing in the organic light emitting diode OLED in correspondence to a voltage applied to a control electrode of the first transistor T1.

A second transistor T2 is connected between the data line DL and the first electrode of the first transistor T1. In addition, a control electrode of the second transistor T2 is connected to the i-th scan line SLi. The second transistor T2 is turned on when an i-th scan signal is provided to the i-th scan line SLi, and electrically connects the data line DL and the first electrode of the first transistor T1.

A third transistor T3 is connected between the second electrode of the first transistor T1 and the control electrode of the first transistor T1. A control electrode of the third transistor T3 is connected to the i-th scan line SLi. The third transistor T3 is turned on when the i-th scan signal is provided to the i-th scan line SLi, and electrically connects the second electrode of the first transistor T1 and the control electrode of the first transistor T1. Accordingly, when the third transistor T3 is turned on, the first transistor T1 is connected in the form of a diode.

A fourth transistor T4 is connected between a node ND and an initialization power generating unit (not shown). In addition, a control electrode of the fourth transistor T4 is connected to an i−1-th scan line SLi−1. The fourth transistor T4 is turned on when an i−1-th scan signal is provided to the i−1-th scan line SLi−1, and provides an initialization voltage Vint to the node ND.

The fifth transistor T5 is connected between the power supply line PL and the first electrode of the first transistor T1. A control electrode of the fifth transistor T5 is connected to the i-th light emission control line ECLi.

The sixth transistor T6 is connected between the second electrode of the first transistor T1 and the anode electrode of the organic light emitting diode OLED. In addition, a control electrode of the sixth transistor T6 is connected to the i-th light emission control line ECLi.

A seventh transistor T7 is connected between the initialization power generating unit (not shown) and the anode electrode of the organic light emitting diode OLED. In addition, a control electrode of the seventh transistor T7 is connected to an i+1-th scan line SLi+1. The seventh transistor T7 such as the above is turned on when an i+1-th scan signal is provided to the i+1-th scan line SLi+1, and provides the initialization voltage Vint to the anode electrode of the organic light emitting diode OLED.

The seventh transistor T7 may improve the ability of the pixel PX to express black. Specifically, when the seventh transistor T7 is turned on, a parasitic capacitor (not shown) of the organic light emitting diode OLED is discharged. Then, when black luminance is implemented, the organic light emitting diode OLED does not emit light due to a leakage current from the first transistor T1, and accordingly, the ability to express black may be improved.

Additionally, FIG. 4 illustrates the control electrode of the seventh transistor T7 being connected to the i+1-th scan line SLi+1, but the embodiment of the present disclosure is not limited thereto. In an embodiment of the present disclosure, the control electrode of the seventh transistor T7 may be connected to the i-th scan line SLi or the i−1-th scan line SLi−1.

Although FIG. 4 illustrates a PMOS as a reference, the embodiment of the present disclosure is not limited thereto. In an embodiment of the present disclosure, the pixel circuit CC may be composed of an NMOS. In an embodiment of the present disclosure, the pixel circuit CC may be composed of a combination of an NMOS and a PMOS.

The capacitor CP is disposed between the power line PL and the node ND. The capacitor CP stores a voltage corresponding to a data signal. When the fifth transistor T5 and the sixth transistor T6 are turned on, the amount of current flowing in the first transistor T1 may be determined according to the voltage stored in the capacitor CP.

In the present disclosure, an equivalent circuit of the pixel PX is not limited to the equivalent circuit illustrated in FIG. 4. In an embodiment of the present disclosure, the pixel PX may be implemented in various forms for emitting the organic light emitting diode OLED.

Figure 5:
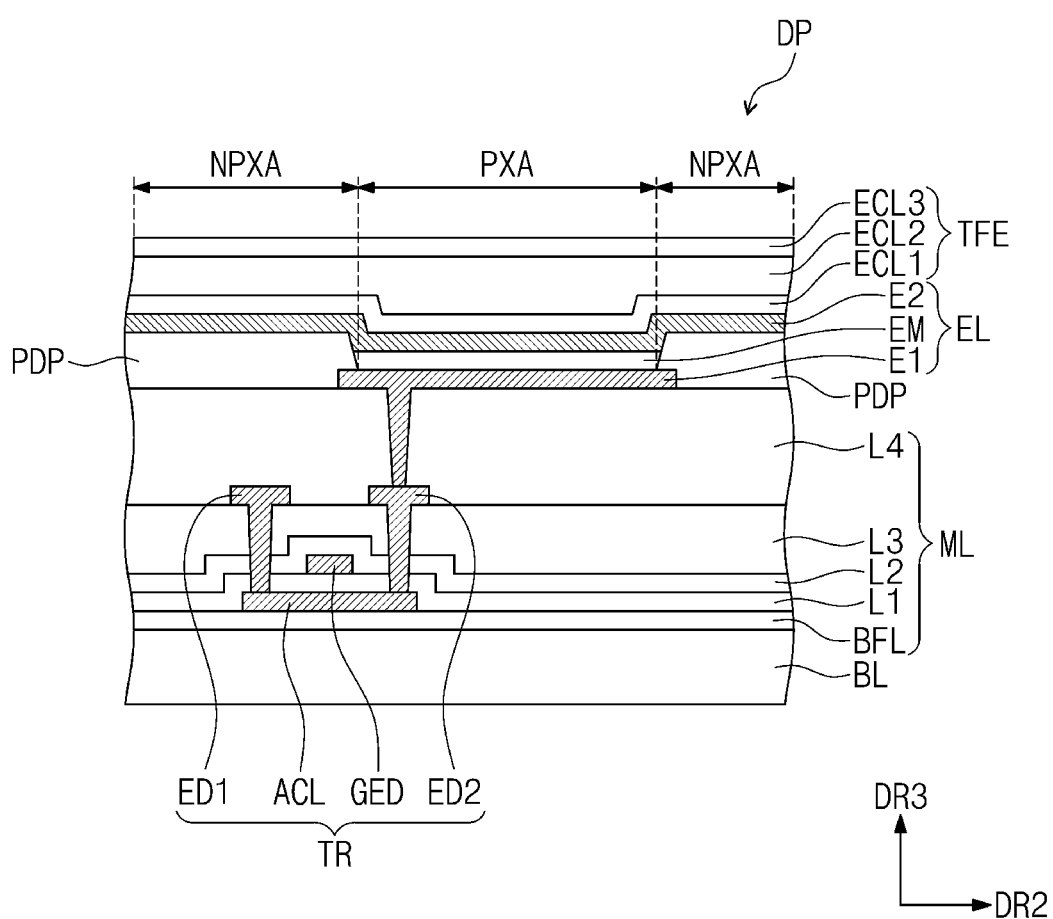
FIG. 5 is a cross-sectional view showing some components of a display panel according to an embodiment of the present disclosure.

FIG. 5 is a cross-sectional view showing some components of a display panel according to an embodiment of the present disclosure.

Referring to FIG. 5, the display panel DP may include a base layer BL, the circuit layer ML, a light emitting element layer EL, and the encapsulation layer TFE. The circuit layer ML may include a transistor TR and a plurality of insulation layers BFL, L1, L2, L3, and L4.

An insulation layer BFL may be disposed on the base layer BL, and the transistor TR may be disposed on the insulation layer BFL. The transistor TR of FIG. 5 may be the first transistor T1 illustrated in FIG. 4. The transistor TR may include a semiconductor layer ACL, a control electrode GED, a first electrode ED1, and a second electrode ED2.

The semiconductor layer ACL may be disposed on the insulation layer BFL. The insulation layer BFL may be a buffer layer which provides a modified surface to the semiconductor layer ACL. In this case, the semiconductor layer ACL may have higher adhesion to the insulation layer BFL than the base layer BL. In addition, the insulation layer BFL may be a barrier layer which protects the lower surface of the semiconductor layer ACL. In this case, the insulation layer BFL may block the base layer BL itself or the penetration of contaminants or moisture introduced through the base layer BL into the semiconductor layer ACL. Alternatively, the insulation layer BFL may be a light blocking layer which blocks an external light incident through the base layer BL to be incident on the semiconductor layer ACL. In this case, the insulation layer BLF may further include a light blocking material.

The semiconductor layer ACL may contain poly silicon or amorphous silicon. In addition to the above, the semiconductor layer ACL may include a metal oxide semiconductor. The semiconductor layer ACL may include a channel region serving as a path in which an electron or a hole may move, and a first ion doping region and a second ion doping region disposed with the channel region interposed therebetween.

A first insulation layer L1 is disposed on the insulation layer BFL, and may cover the semiconductor layer ACL. The first insulation layer L1 may include an inorganic material. The inorganic material may include at least one of silicon nitride, silicon oxy nitride, silicon oxide, titanium oxide, or aluminum oxide.

On the first insulation layer L1, the control electrode GED may be disposed. A second insulation layer L2 is disposed on the first insulation layer L1, and may cover the control electrode GED. The second insulation layer L2 may include an inorganic material.

On the second insulation layer L2, a third insulation layer L3 may be disposed. On the third insulation layer L3, the first electrode ED1 and the first electrode ED2 may be disposed. The first electrode ED1 and the second electrode ED2 may be connected to the semiconductor layer ACL through through-holes passing through the first insulation layer L1, the second insulation layer L2, and the third insulation layer L3.

A fourth insulation layer L4 is disposed on the third insulation layer L3, and may cover the first electrode ED1 and the second electrode ED2. The fourth insulation layer L4 may be composed of a single layer or a plurality of layers. For example, the single layer may include an organic layer. The plurality of layers may be provided by stacking an organic layer and an inorganic layer. The fourth insulation layer L4 may be a planarization layer which provides a flat surface to an upper portion.

On the fourth insulation layer L4, the light emitting element layer EL and a pixel definition film PDP may be disposed.

The light emitting element layer EL may include a first electrode E1, a light emitting layer EM, and a second electrode E2. The first electrode E1 is disposed on the fourth insulation layer L4, and may be electrically connected to the second electrode ED2 through a through-hole defined in the fourth insulation layer L4. The light emitting element layer EL may correspond to the organic light emitting diode OLED described with reference to FIG. 4.

The pixel definition film PDP may be disposed on the circuit layer ML and define a pixel region PXA. The pixel definition film PDP may be disposed on the fourth insulation layer L4 while covering at least a portion of the first electrode E1. A portion of the first electrode E1 may not be covered by the pixel definition film PDP, and the portion may correspond to the pixel region PXA.

The light emitting layer EM may be disposed between the first electrode E1 and the second electrode E2. The light emitting layer EM may have a single-layered structure having a single layer formed of a single material, a single-layered structure having a single layer formed of a plurality of different materials, or a multi-layered structure having a plurality of layers formed of a plurality of different materials.

The light emitting layer EM may include an organic material. The organic material is not particularly limited as long as it is a commonly used material. For example, the light emitting layer EM may be composed of at least one material among materials emitting red, green, or blue colors, and may include a fluorescent material or a phosphorescent material.

The second electrode E2 may be disposed on the light emitting layer EM and the pixel definition film PDP. The second electrode E2 may be receiving the second power ELVSS (see FIG. 4).

On the second electrode E2, the encapsulation layer TFE is disposed. The encapsulation layer TFE may directly cover the second electrode E2. In an embodiment of the present disclosure, between the encapsulation layer TFE and the second electrode E2, a capping layer which covers the second electrode E2 may further be disposed. In this case, the encapsulation layer TFE may directly cover the capping layer. The capping layer may include an organic material. The capping layer protects the second electrode E2 from a subsequent process, such as a sputtering process, and improves the light emitting efficiency of the light emitting element layer EL The capping layer may have a greater refractive index than a first inorganic layer ECL1 to be described later.

The encapsulation layer TFE may include the first inorganic layer ECL1, and organic layer ECL2, and a second inorganic layer ECL3. The organic layer ECL2 may be disposed between the first inorganic layer ECL1 and the second inorganic layer ECL3. The first inorganic layer ECL1 and the second inorganic layer ECL3 may be provided by depositing an inorganic material, and the organic layer ECL2 may be provided by depositing, printing, or coating an organic material.

The first inorganic layer ECL1 and the second inorganic layer ECL3 protect the light emitting element layer EL from moisture and oxygen, and the organic layer ECL2 protects the light emitting element layer EL from foreign materials such as dust particles. The first inorganic layer ECL1 and the second inorganic layer ECL3 may include at least one of silicon nitride, silicon oxy nitride, silicon oxide, titanium oxide, or aluminum oxide. The organic layer ECL2 may include a polymer, for example, an acrylic organic layer. However, this is only exemplary, and the embodiment of the present disclosure is not limited thereto.

FIG. 5 exemplarily illustrates that the encapsulation layer TFE includes two inorganic layers and one organic layer, but the embodiment of the present disclosure is not limited thereto. For example, the encapsulation layer TFE may include three inorganic layers and two organic layers, and in this case, the encapsulation layer TFE may have a structure in which an inorganic layer and an organic layer are alternatively stacked.

Figure 6:
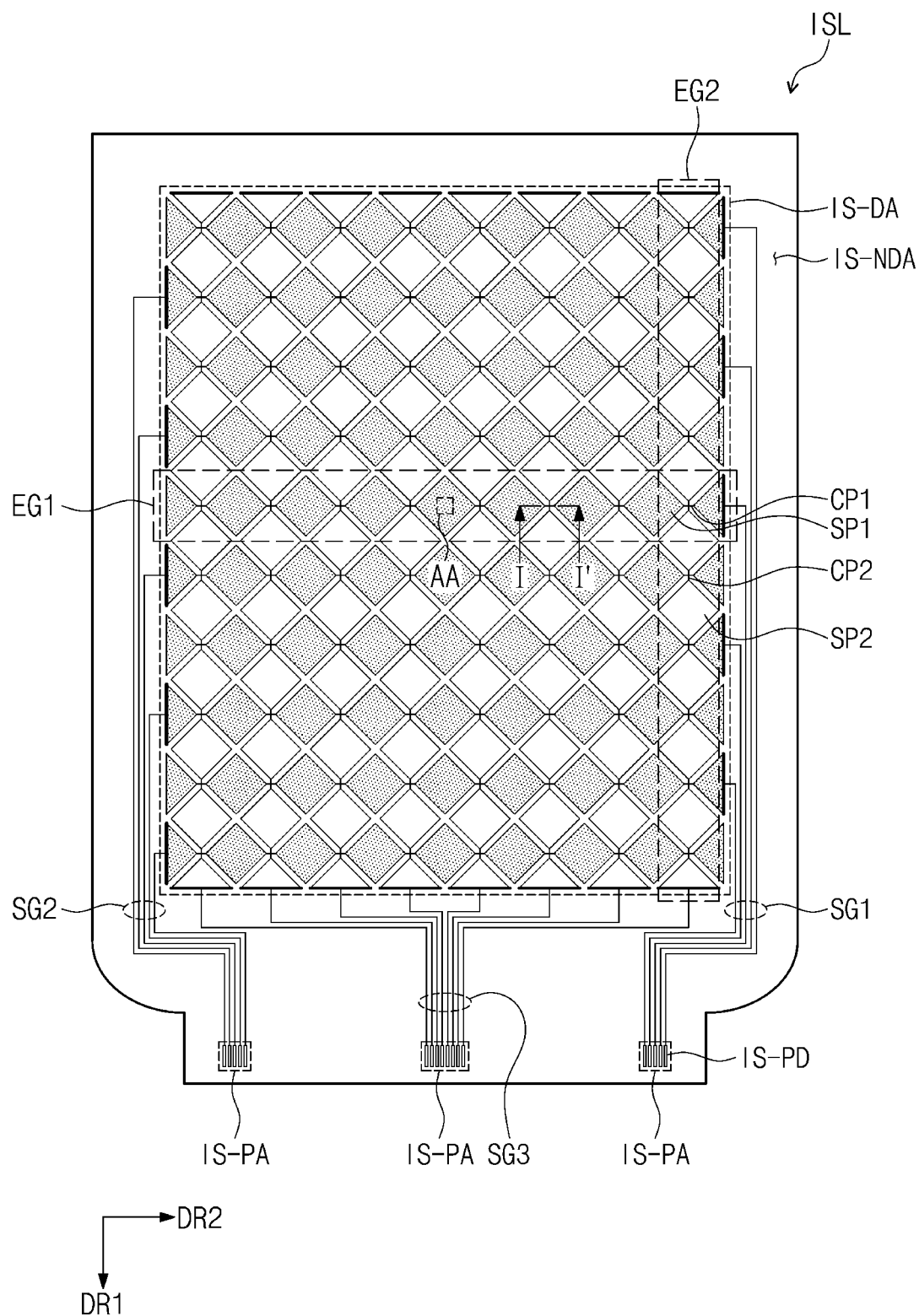
FIG. 6 is a plan view of an input sensing layer according to an embodiment of the present disclosure.

FIG. 6 is a plan view of an input sensing layer according to an embodiment of the present disclosure. The input sensing layer ISL to be described hereinafter may be equally applied to the input sensing panel ISP (see FIG. 2B).

The input sensing layer ISL may include a sensing region IS-DA corresponding to the display region DP-DA and a line region IS-NDA corresponding to the non-display region DP-NDA of the display panel DP illustrated in FIG. 3.

The input sensing layer ISL may include first sensing electrodes EG1, second sensing electrodes EG2, a first signal line group SG1 electrically connected to some corresponding electrodes among the first sensing electrodes EG1, a second signal line group SG2 electrically connected to the other electrodes among the first sensing electrodes EG1, and a third signal line group SG3 electrically connected to the second sensing electrodes EG2.

FIG. 6 exemplarily illustrates that the first signal line group SG1 and the second signal line group SG2 are disposed with the sensing region IS-DA interposed therebetween. However, in an embodiment of the present disclosure, the first signal line group SG1 and the second signal line group SG2 may be disposed on the same side of the sensing region IS-DA. In addition, in an embodiment of the present disclosure, each of the first signal line group SG1 and the second signal line group SG2 may be connected to the first sensing electrodes EG1 in a double routing structure.

The first sensing electrodes EG1 and the second sensing electrodes EG2 are disposed in the sensing region IS-DA. The first signal line group SG1, the second signal line group SG2, and the third signal line group SG3 are disposed in the line region IS-NDA.

In the present embodiment, the input sensing layer ISL may be a capacitive touch sensor which senses an external input in a mutual cap manner. Any one of the first sensing electrodes EG1 and the second sensing electrodes EG2 receive a detection signal, and the other thereof outputs an amount of change in capacitance between the first sensing electrodes EG1 and the second sensing electrodes EG2 as an output signal.

Each of the first sensing electrodes EG1 is extended along the second direction DR2. The first sensing electrodes EG1 are disposed spaced apart in the first direction DR1. Each of the second sensing electrodes EG2 is extended along the first direction DR1. The second sensing electrodes EG2 are disposed spaced apart in the second direction DR2.

The first sensing electrodes EG1 may include first sensor parts SP1 and first connecting parts CP1. The first sensor parts SP1 are arranged along the second direction DR2. Each of the first connecting parts CP1 may connect two adjacent first sensor parts SP1 among the first sensor parts SP1.

The second sensing electrodes EG2 may include second sensor parts SP2 and second connecting parts CP2. The second sensor parts SP2 are arranged along the first direction DR1. Each of the second connecting parts CP2 may connect two adjacent second sensor parts SP2 among the second sensor parts SP2.

The first signal line group SG1, the second signal line group SG2, and the third signal line group SG3 may be electrically connected to corresponding signal pads IS-PD. In the line region IS-NDA, a region in which the signal pads IS-PD are disposed may be defined as a pad region IS-PA. To the pad region IS-PA, a circuit substrate not shown may be connected.

Figure 7:
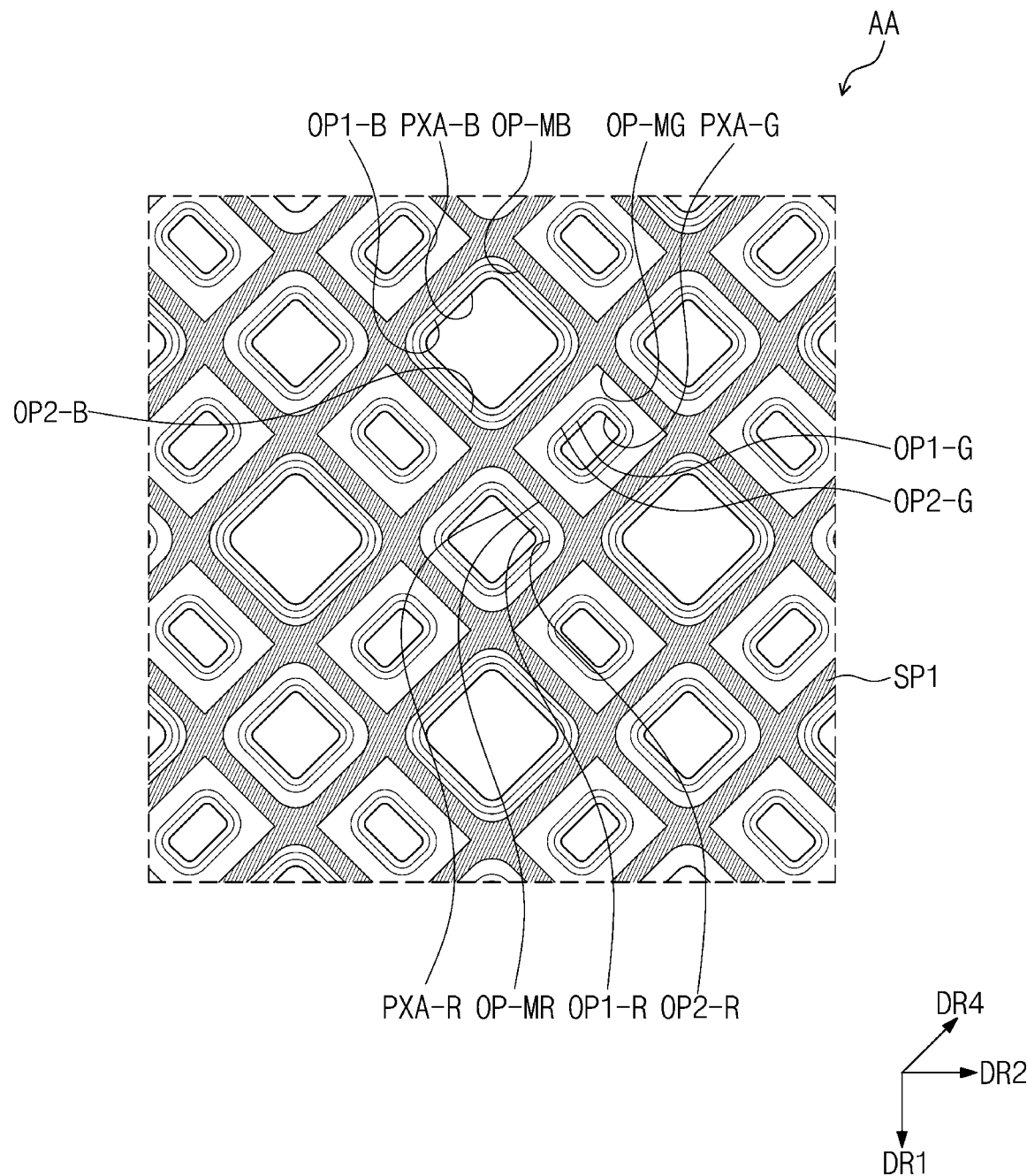
FIG. 7 is a plan view of enlarged region AA of FIG. 6.

FIG. 7 is a plan view of enlarged region AA of FIG. 6.

The arrangement relationship of a first pixel region PXA-R, a second pixel region PXA-B, and a third pixel region PXA-G of the display panel DP (see FIG. 5) is illustrated. The first pixel region PXA-R, the second pixel region PXA-B, and the third pixel region PXA-G are defined the same as the pixel region PXA described with reference to FIG. 5.

Referring to FIG. 6 and FIG. 7, in the present embodiment, the first pixel region PXA-R, the second pixel region PXA-B, and the third pixel region PXA-G may have different areas. The first pixel region PXA-R may have a first area, the second pixel region PXA-B may have a second area, and the third pixel region PXA-G may have a third area. The second area may be larger than the first area, and the first area may be larger than the third area.

The plurality of pixels PX described with reference to FIG. 3 may include a red pixel which generates a red light, a blue pixel which generates a blue light, and a green pixel which generates a green light. In the present embodiment, the first pixel region PXA-R may correspond to the red pixel, the second pixel region PXA-B may correspond to the blue pixel, and the third pixel region PXA-G may correspond to the green pixel.

The first pixel region PXA-R and the second pixel region PXA-B may alternately be arranged along the first direction DR1 and the second direction DR2. The third pixel region PXA-G is provided in a plurality, and the third pixel regions PXA-G provided in a plurality may be arranged along the first direction DR1 and the second direction DR-2. The first pixel region PXA-R and the third pixel region PXA-G may alternately be arranged along a fourth direction DR4. The second pixel region PXA-B and the third pixel region PXA-G may alternately be arranged along the fourth direction DR4. The fourth direction DR4 is a direction intersecting the first direction DR1 and the second direction DR2, and may be referred to as a diagonal direction.

FIG. 7 illustrates an example in which the first pixel region PXA-R, the second pixel region PXA-B, and the third pixel region PXA-G are arranged in a pentile shape, but the present disclosure is not limited thereto. For example, the first pixel region PXA-R, the second pixel region PXA-B, and the third pixel region PXA-G may be arranged in a stripe shape. The stripe shape may mean that the first pixel region PXA-R, the second pixel region PXA-B, and the third pixel region PXA-G are alternately arranged along the second direction DR2, and the same pixel regions are arranged in the first direction DR1.

Each of the first sensor parts SP1 and the second sensor parts SP2 may have a mesh shape. On each of the first sensor parts SP1 and the second sensor parts SP2, a plurality of sensor openings OP-MR. OP-MG, and OP-MB may be defined. Therefore, on a plane, the first sensor parts SP1 and the second sensor parts SP2 may not overlap the first pixel region PXA-R, the second pixel region PXA-B, and the third pixel region PXA-G. For example, in regions corresponding to the first pixel region PXA-R, first sensor openings OP-MR may be defined, in regions corresponding to the second pixel region PXA-B, second sensor openings OP-MB may be defined, and in regions corresponding to the third pixel region PXA-Q third sensor openings OP-MG may be defined.

Figure 8:
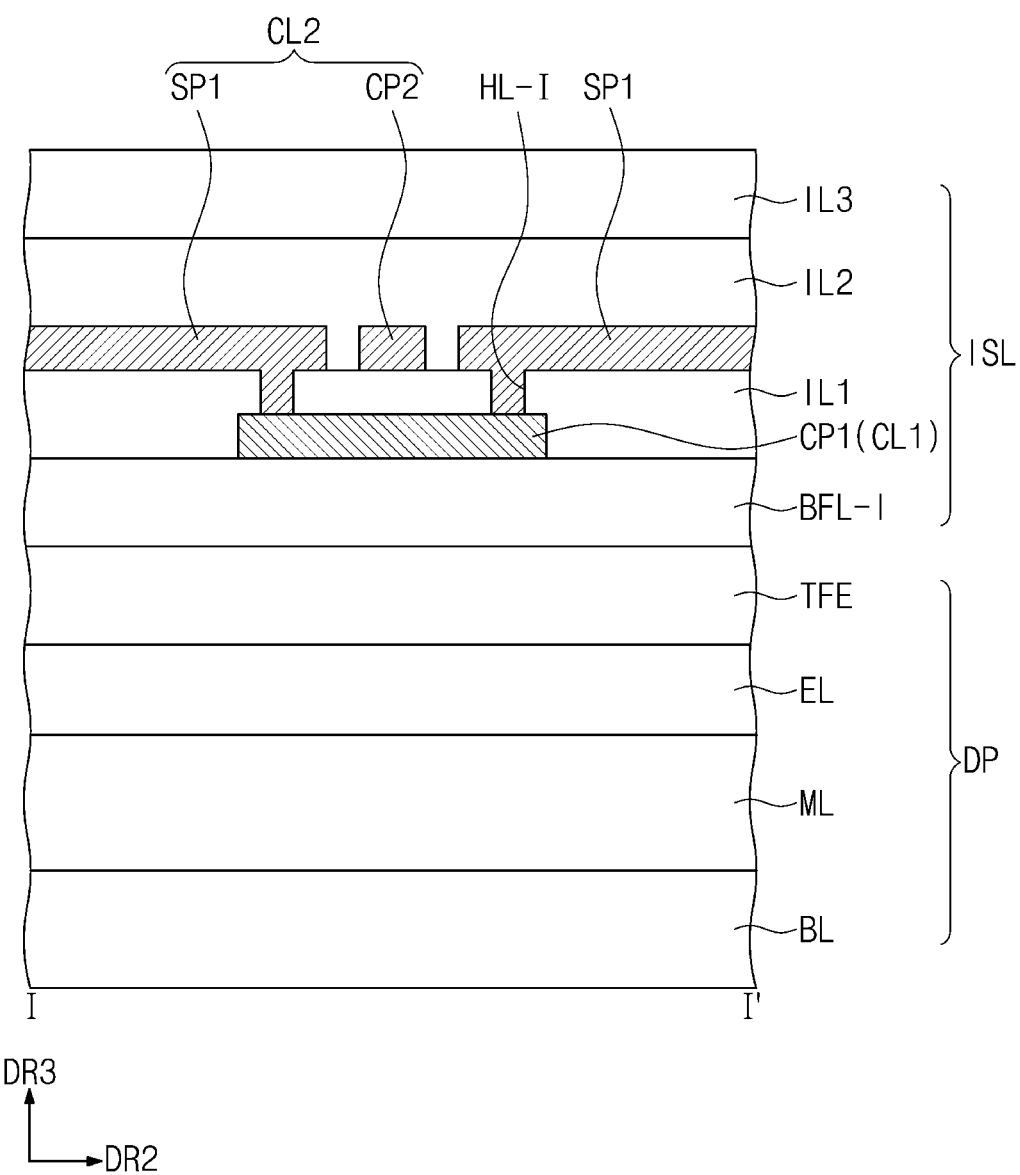
FIG. 8 is a cross-sectional view taken along region I-I' of FIG. 6.
Figure 9:
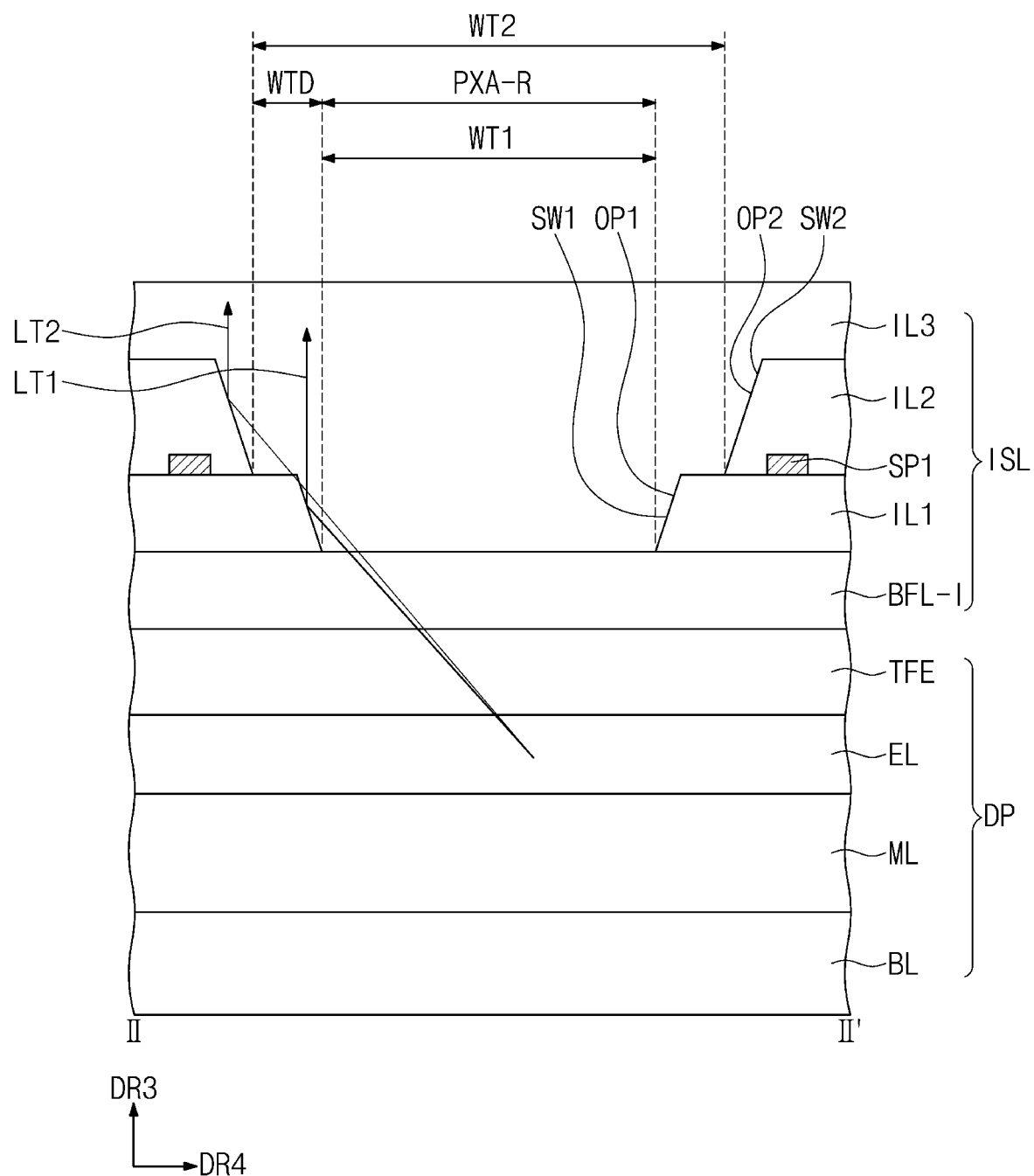
FIG. 9 is a cross-sectional view taken along region II-II' of FIG. 7.

FIG. 8 is a cross-sectional view taken along region I-I' of FIG. 6. FIG. 9 is a cross-sectional view taken along region II-II' of FIG. 7.

Referring to FIG. 7, FIG. 8, and FIG. 9, the input sensing layer ISL may include a buffer layer BFL-1, a first conductive layer CL1, a second conductive layer CL2, a first insulation layer IL1, a second insulation layer IL2, and a third insulation layer IL3.

The buffer layer BFL-I may be disposed on the encapsulation layer TFE. The buffer layer BFL-I may include an inorganic material. For example, the inorganic material may be silicon nitride. The thickness of the buffer layer BFL-I may be 2000 angstroms. However, this is only exemplary. The material and thickness of the buffer layer BFL-I are not limited thereto. In addition, in an embodiment of the present disclosure, the buffer layer BFL-I may be omitted.

On the buffer layer BFL-I, the first insulation layer CL1 may be disposed. The first insulation layer CL1 may include the first connecting parts CP1.

On the first conductive layer CL1, the first insulation layer IL1 may be disposed. The thickness of the first insulation layer IL1 may be 1.5 micrometers to 3 micrometers, but the embodiment of the present disclosure is not limited thereto.

The first insulation layer IL1 has a first refractive index, and may include an organic material. The organic material may include at least any one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin. However, this is only exemplary, and the organic material is not limited to the above examples.

In regions overlapping the first pixel region PXA-R, the second pixel region PXA-B, and the third pixel region PXA-G of the first insulation layer IL1, a plurality of first openings may be defined. FIG. 9 illustrates one first opening OP1-R. The first opening OP1-R may be defined in a region corresponding to the first pixel region PXA-R. For example, on a plane, the first opening OP1-R may overlap the first pixel region PXA-R. On a plane, the area of the first opening OP1-R may be the same as the area of the first pixel region PXA-R, or may be larger than the area of the first pixel region PXA-R. In the present disclosure, some indication lines of a reference numeral of an opening are shown to indicate a side surface of a component defining the opening.

On the first insulation layer IL1, the second conductive layer CL2 may be disposed. The second conductive layer CL2 may include the first sensor parts SP1, the second sensor parts SP2, and the second connecting parts CP2.

Among the first sensor parts SP1, two first sensor parts SP1 adjacent to each other may be connected to one first connecting part CP1. The two first sensor parts SP1 may be connected to the first connecting part CP1 through a through-hole HL-I defined on the first insulation layer IL1.

In an embodiment of the present disclosure, the first conductive layer CL1 may include the first sensor parts SP1, the second sensor parts SP2, and the second connecting parts CP2, and the second conductive layer CL2 may include the first connecting parts CP1.

On the second conductive layer CL2, the second insulation layer IL2 may be disposed. The second insulation layer IL2 may have a second refractive index. The second insulation layer IL2 may include an organic material.

In the second insulation layer IL2, in a region corresponding to the plurality of first openings, a plurality of second openings may be defined. FIG. 9 illustrates one second opening OP2-R. The second opening OP2-R may be defined in a region corresponding to the first pixel region PXA-R.

A maximum width WT1 of the first opening OP1-R may be smaller than a maximum width WT2 of the second opening OP2-R. On a plane, the area of the first opening OP1-R may be smaller than the area of the second opening OP2-R. Therefore, on a plane, a side surface of the first insulation layer IL1 defining the first opening OP1-R may be surrounded by a side surface of the second insulation layer IL2 defining the second opening OP2-R.

Referring to FIG. 7, a first opening OP1-B, a second opening OP2-B, a first opening OP1-G, and a second opening OP2-G are illustrated. The first opening OP1-B and the first opening OP1-G are openings defined in the first insulation layer IL1, and the second opening OP2-B and the second opening OP2-G are openings defined in the second insulation layer IL2. The first opening OP1-B and the second opening OP2-B may be defined in a region corresponding to the second pixel region PXA-B, and the first opening OP1-G and the second opening OP2-G may be defined in a region corresponding to the third pixel region PXA-G.

The first opening OP1-B and the first opening OP1-G may correspond to the first opening OP1-R described with reference to FIG. 9, and the second opening OP2-B and the second opening OP2-G may correspond to the second opening OP2-R described with reference to FIG. 9. Therefore, a detailed description thereof will be omitted.

On the second insulation layer IL2, the third insulation layer IL3 may be disposed. The third insulation layer IL3 may have a third refractive index. The third refractive index may be a value higher than the first refractive index and the second refractive index. For example, the first refractive index and the second refractive index may be 1.45 to 1.55. The third refractive index may be 1.65 to 1.70. The difference between the third refractive index and the first refractive index, and the difference between the third refractive index and the second refractive index may be 0.1 or greater. The ranges of the first refractive index, the second refractive index, and the third refractive index are exemplarily presented. Therefore, as long as the third refractive index is higher than the first refractive index and the second refractive index, ranges of the first, second, and third refractive indexes are not limited to the above examples.

The third insulation layer IL3 may fill the first opening OP1-R and the second opening OP2-R. In addition, the third insulation layer IL3 may provide a flat upper surface.

A light provided from the light emitting element layer EL may be emitted not only in the front direction, for example, the third direction DR3, but also in the lateral direction. Light efficiency may be determined on the basis of a light emitted in the front direction. According to an embodiment of the present disclosure, lights LT1 and LT2 emitted in the lateral direction may be totally reflected at the boundary between the first insulation layer IL1 and the third insulation layer IL3, or at the boundary between the second insulation layer IL2 and the third insulation layer IL3. Therefore, the light path of the lights LT1 and LT2 may be changed to the third direction DR3 or to a direction close to the third direction DR3. As a result, the light efficiency of the display device DD (see FIG. 1) may be improved.

Figure 10A:
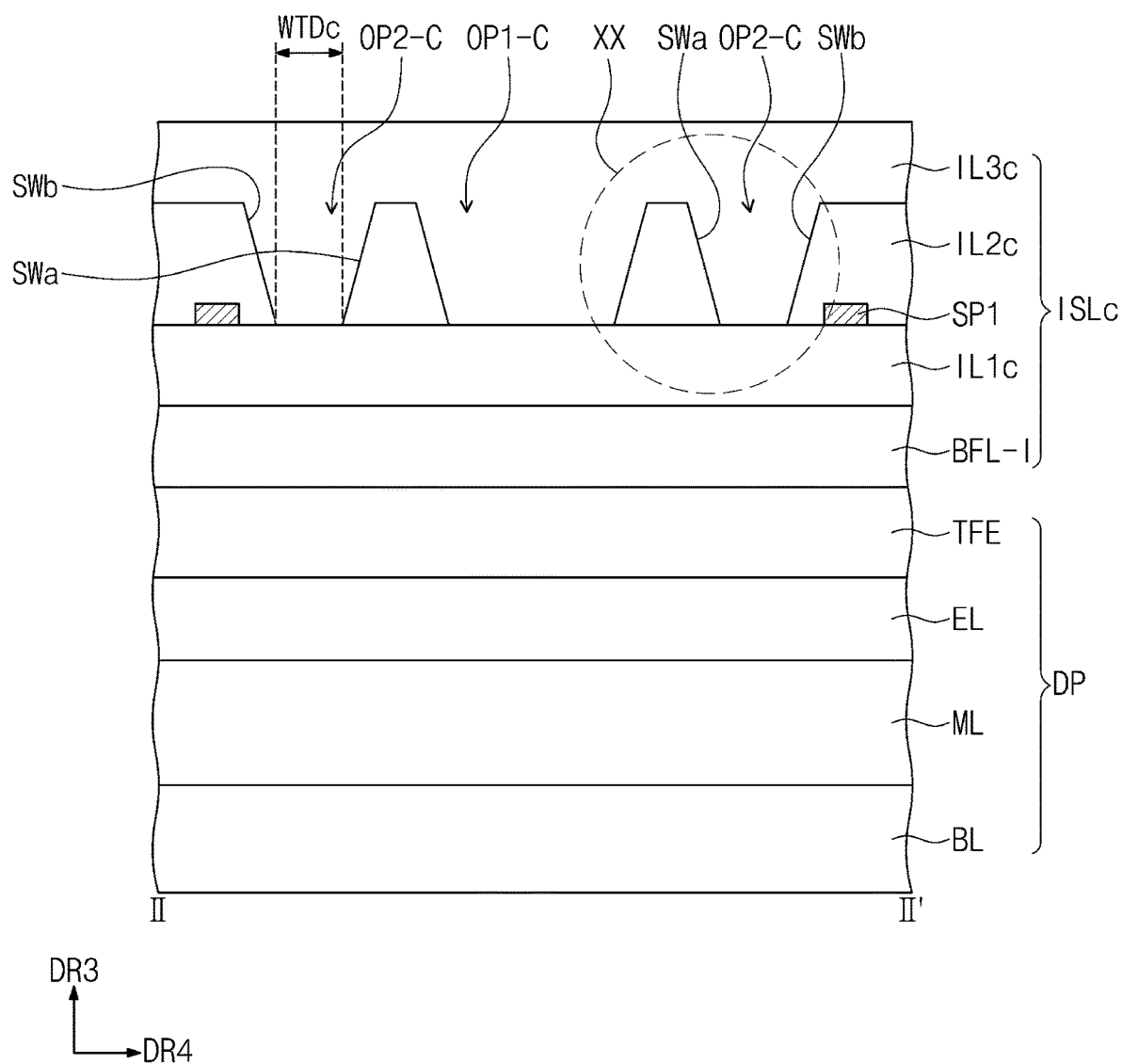
FIG. 10A is a cross-sectional view taken along a portion of a display device according to a comparative example of the present disclosure.
Figure 10B:
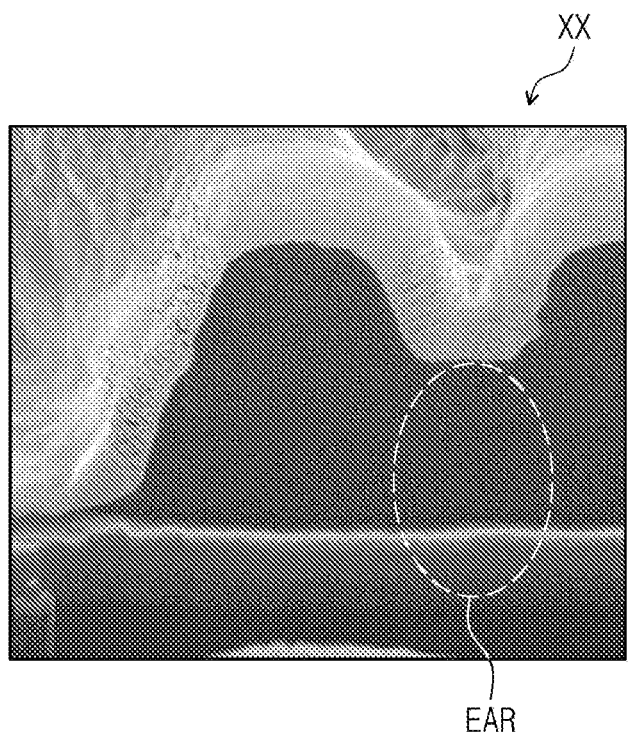
FIG. 10B is a cross-sectional view of enlarged region XX illustrated in FIG. 10A.

FIG. 10A is a cross-sectional view taken along a portion of a display device according to a comparative example of the present disclosure. FIG. 10B is a cross-sectional view of enlarged region XX illustrated in FIG. 10A.

Referring to FIG. 10A and FIG. 10B, an input sensing layer ISLc according to Comparative Example of the present disclosure may include the buffer layer BFL-1, a first conductive layer (not shown) disposed on the buffer layer BFL-I, a first insulation layer IL1c disposed on the first conductive layer, a second conductive layer CL2c disposed on the first insulation layer IL1c, a second insulation layer IL2c disposed on the second conductive layer CL2c, and a third insulation layer IL3c disposed on the second insulation layer IL2c.

The first insulation layer IL1c may include an inorganic material. For example, the inorganic material may be silicon nitride. The thickness of the first insulation layer IL1c may be 3000 angstroms.

The second insulation layer IL2c and the third insulation layer IL3c include an organic material, and the refractive index of the third insulation layer IL3c may be higher than the refractive index of the second insulation layer IL2c.

The second insulation layer IL2c may have a first opening OP1-C and a second opening OP2-C surrounding the first opening OP1-C. The second opening OP2-C may be defined by a first sidewall SWa and a second sidewall SWb. The first sidewall SWa may be a sidewall closer to the first opening OP1-C than the second sidewall SWb.

Some of lights provided from the display panel DP may be totally reflected at the second sidewall SWb, and thus, may have a changed light path, so that light efficiency may be improved. The closer the second sidewall SWb is to the first pixel region PXA-R, the better the light emitting efficiency. That is, in order to improve light emitting efficiency, the first sidewall SWa and the second sidewall SWb should have a short distance WTDc therebetween, which may cause process failure. A cross-sectional view of a position at which process failure occurred is illustrated in FIG. 10B.

Referring to FIG. 10B, since the first sidewall SWa and the second sidewall SWb are not properly provided, a failure region EAR in which the third insulation layer IL3c is not filled may be generated in a region corresponding to the second opening OP2-C. In the failure region EAR, there is no difference in refractive indexes. Therefore, the light path of a light emitted in the lateral direction is not controlled, so that light efficiency may be reduced.

However, according to an embodiment of the present disclosure illustrated in FIG. 9, a first opening OP1 and a second opening OP2 are defined in different insulation layers, for example, in the first insulation layer IL1 and the second insulation layer IL2. Therefore, even when a distance WTD between a first sidewall SW1 defining the first opening OP1-R and a second sidewall SW2 defining the second opening OP2-R is reduced, a phenomenon in which the second sidewall SW2 is not properly provided may not occur.

Figure 11:
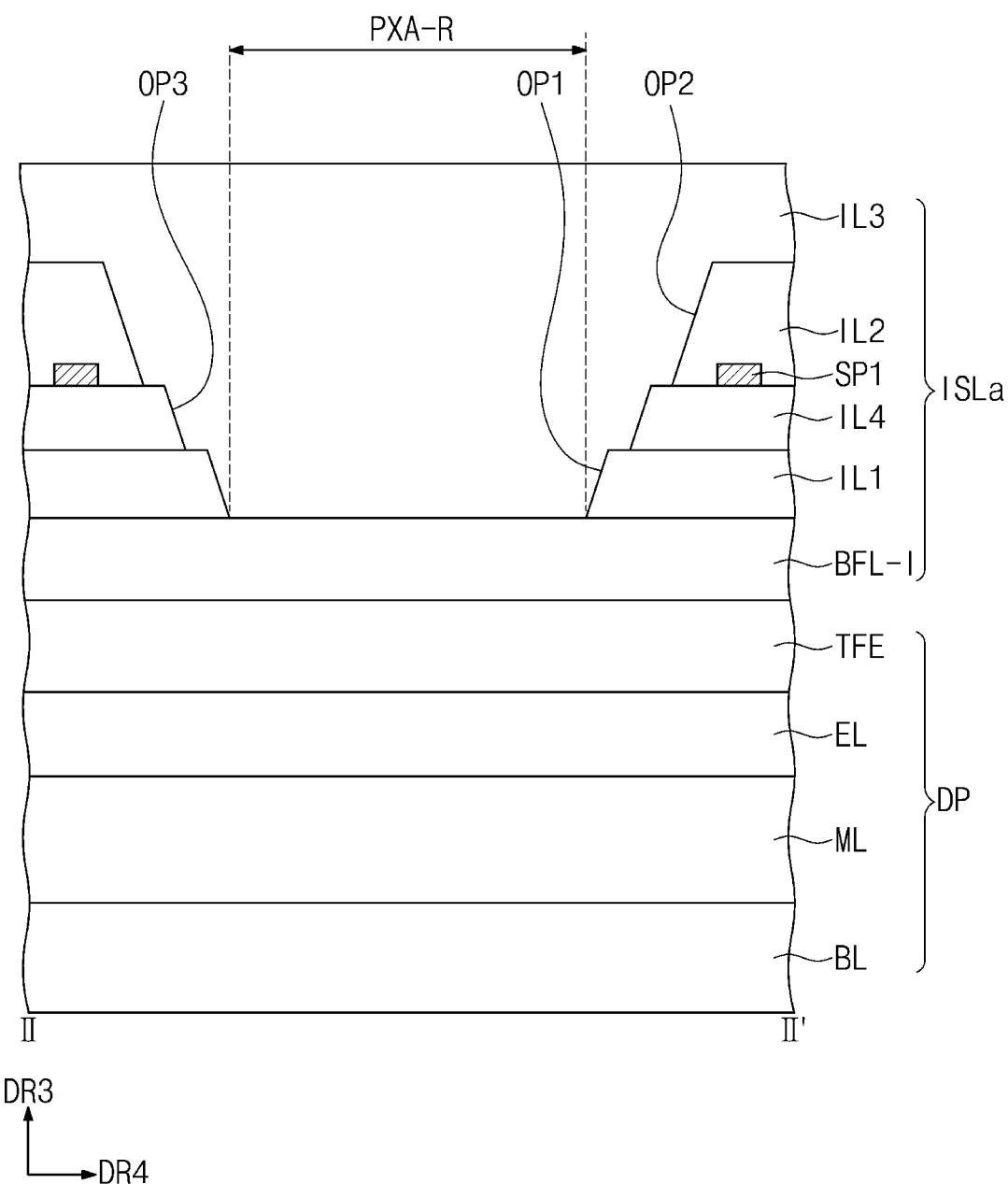
FIG. 11 is a cross-sectional view taken along a region corresponding to the region II-II' of FIG. 7 according to an embodiment of the present disclosure.

FIG. 11 is a cross-sectional view taken along a region corresponding to the region II-II' of FIG. 7 according to an embodiment of the present disclosure. In describing FIG. 11, components which are substantially the same as those in FIG. 9 are denoted by the same reference numerals, and descriptions thereof are omitted.

Referring to FIG. 11, an input sensing layer ISLa may further include a fourth insulation layer IL4. The fourth insulation layer IL4 may be disposed between the first insulation layer IL1 and the second insulation layer IL2. For example, the fourth insulation IL4 may be disposed between the first insulation layer IL1 and the second conductive layer CL2 (see FIG. 8). In this case, the through-hole HL-1 (see FIG. 8) may be defined on the first insulation layer IL1 and the fourth insulation layer IL4. In an embodiment of the present disclosure, the fourth insulation layer IL4 may be disposed between the second conductive layer CL2 and the second insulation layer IL2. That is, the fourth insulation layer IL4 may cover the second conductive layer CL2.

On the fourth insulation layer IL4, a third opening OP3 may be defined. The third opening OP3 may overlap the first pixel region PXA-R on a plane. The third opening OP3 may be larger than the first opening OP1, and may be smaller than the second opening OP2. Therefore, on a cross-section, sidewalls of the first insulation layer IL1, the fourth insulation layer IL4, and the second insulation layer IL2 which define the first opening OPt, the third opening OP3, and the second opening OP2 and some upper surfaces adjacent to the sidewalls may have a step shape.

The third insulation layer IL3 may be filled in the third opening OP3. The fourth insulation layer IL4 may have a fourth refractive index which is lower than the third refractive index of the third insulation layer IL3. A light emitted in the lateral direction from the display panel DP may be totally reflected at the boundary between the third insulation layer IL3 and the fourth insulation layer IL4. Therefore, the light path of the totally-reflected light may be changed to the third direction DR3 or to a direction close to the third direction DR3. As a result, the light efficiency of the display device DD (see FIG. 1) may be improved.

Figure 12:
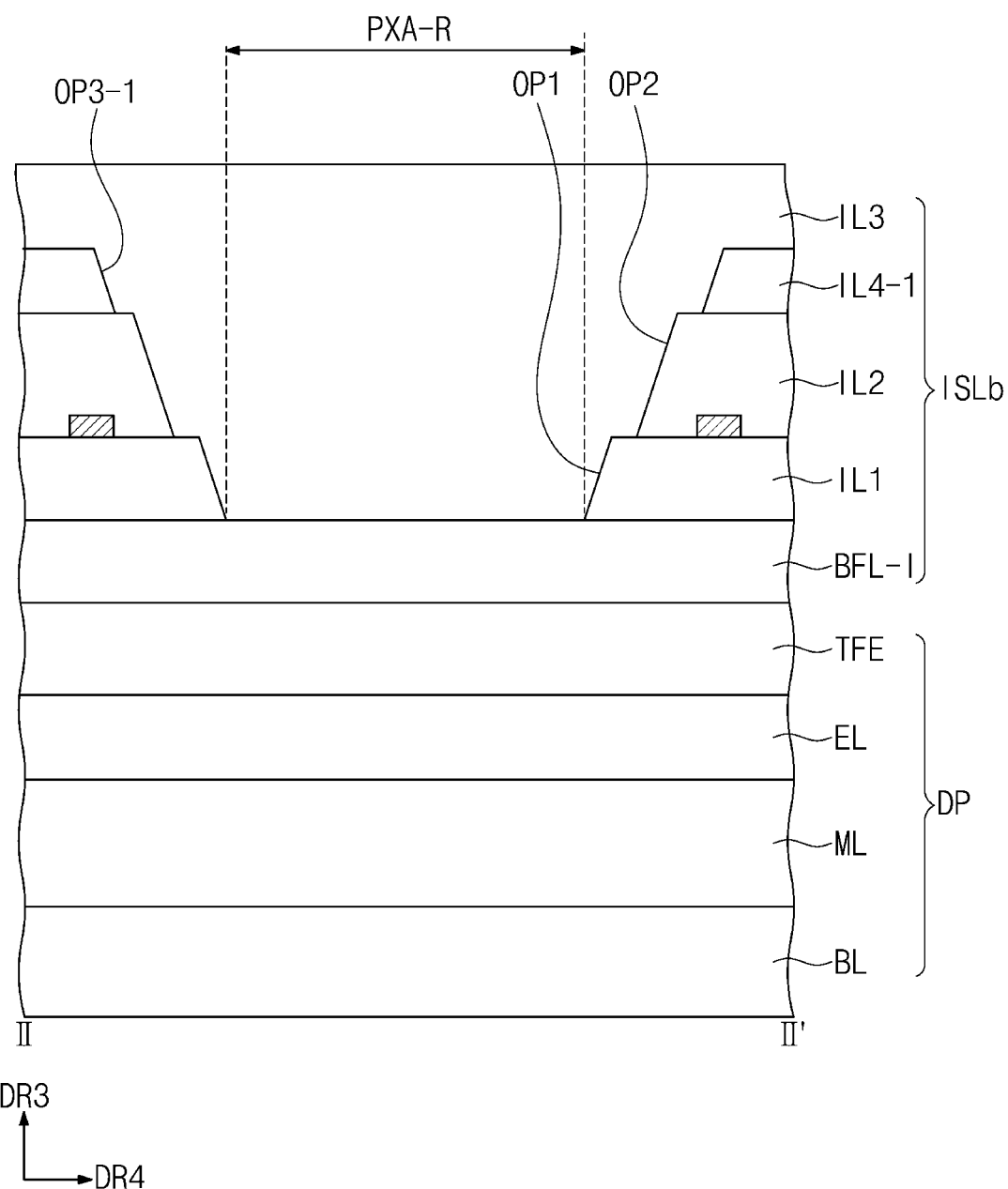
FIG. 12 is a cross-sectional view taken along a region corresponding to the region II-II' of FIG. 7 according to an embodiment of the present disclosure.

FIG. 12 is a cross-sectional view taken along a region corresponding to the region II-II' of FIG. 7 according to an embodiment of the present disclosure. In describing FIG. 12, components which are substantially the same as those in FIG. 9 are denoted by the same reference numerals, and descriptions thereof are omitted.

Referring to FIG. 12, an input sensing layer ISLb may further include a fourth insulation layer IL4-1. The fourth insulation layer IL4-1 may be disposed on the second insulation layer IL2. In addition, the fourth insulation layer IL4-1 may be covered by the third insulation layer IL3.

On the fourth insulation layer IL4-1, a third opening OP3-1 may be defined. The third opening OP3-1 may overlap the first pixel region PXA-R on a plane. The third opening OP3-1 may be larger than the first opening OP1 and the second opening OP2.

The third insulation layer IL3 may be filled in the third opening OP3-1. The fourth insulation layer IL4-1 may have a fourth refractive index which is lower than the third refractive index of the third insulation layer IL3. A light emitted in the lateral direction from the display panel DP may be totally reflected at the boundary between the third insulation layer IL3 and the fourth insulation layer IL4-1.

FIG. 13A to FIG. 13G are cross-sectional views illustrating a method for manufacturing a display device according to an embodiment of the present disclosure.

Figure 13A:
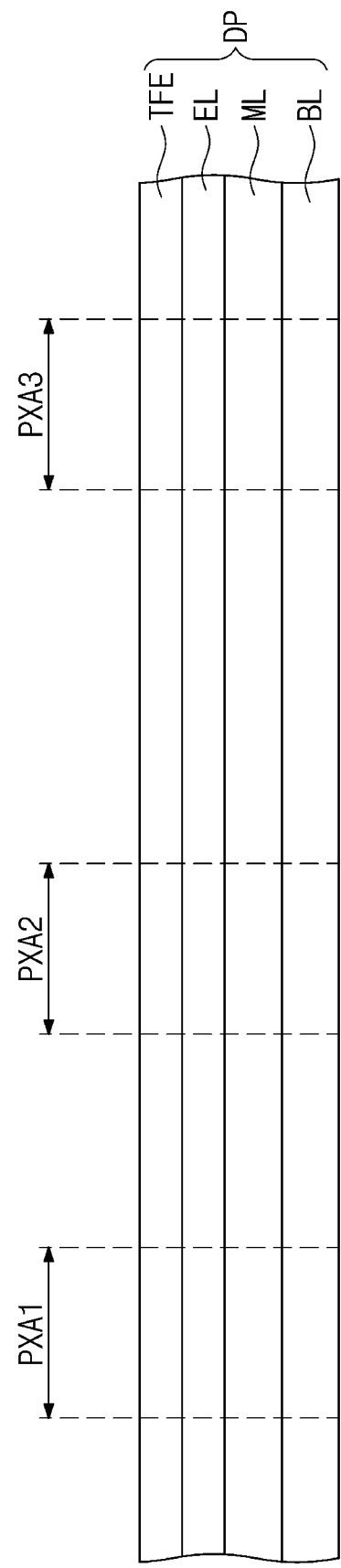

Referring to FIG. 13A, the display panel DP including a plurality of pixel regions PXA1, PXA2, and PXA3 is provided.

A step of providing the display panel DP may include steps of providing the base layer BL, providing the circuit layer ML on the base layer BL, providing the light emitting element layer EL on the circuit layer ML, and providing the encapsulation layer TFE on the light emitting element layer EL.

Each of the plurality of pixel regions PXA1, PXA2, and PXA3 may correspond to each of the first pixel region PXA-R, the second pixel region PXA-B, and the third pixel region PXA-G described with reference to FIG. 7.

Figure 13B:
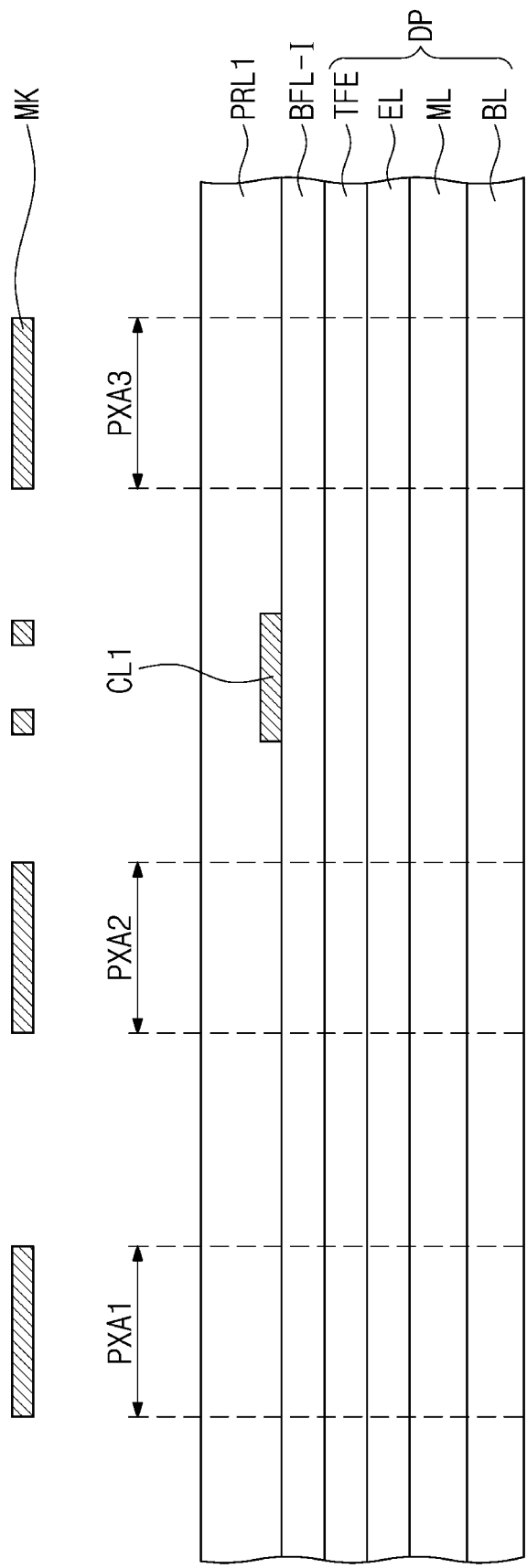

Referring to FIG. 13B, on the display panel DP, the buffer layer BFL-I is provided. On the buffer layer BFL-1, the first conductive layer CL1 is provided.

On the first conductive layer CL1, a first preliminary layer PRL1 is provided. The first preliminary layer PRL1 may be a photoresist layer. The first preliminary layer PRL1 may be a negative photoresist layer or a positive photoresist layer. With reference to FIG. 13B, an example in which the first preliminary layer PRL1 is a negative photoresist layer will be described.

On the first preliminary layer PRL1, a mask MK is disposed. The mask MK may be a binary mask which includes a transmissive portion and a light blocking portion. After the mask MK is disposed, light is irradiated. When the photosensitized first preliminary layer PRL1 is developed, a portion of the first preliminary layer PRL1 which has not been irradiated with the light may be removed.

Figure 13C:
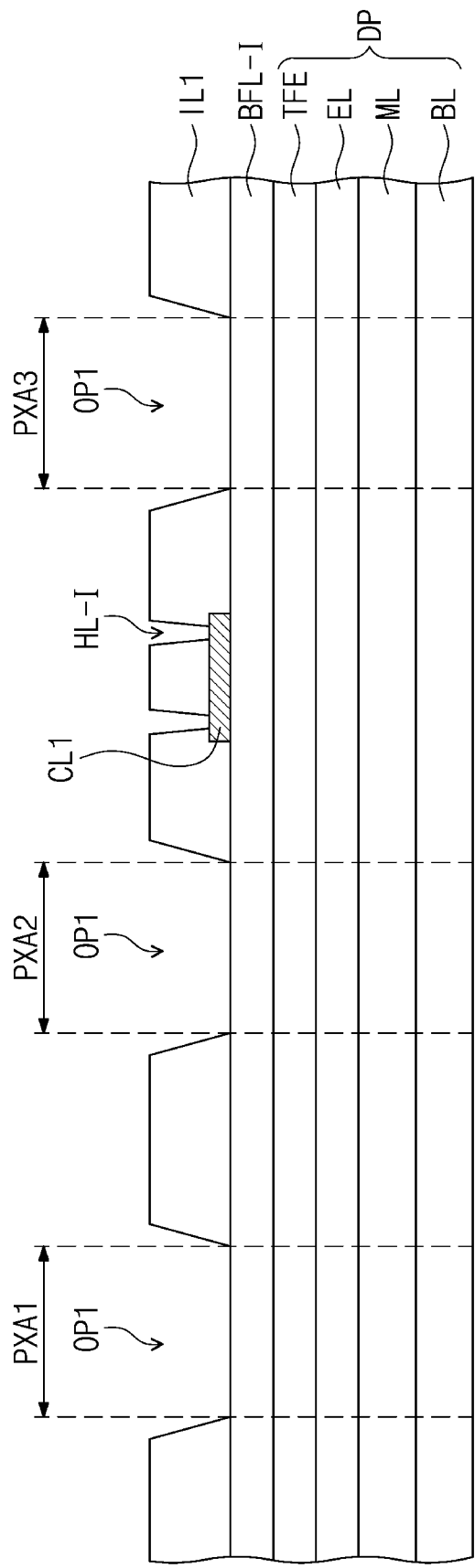

Referring to FIG. 13C, the first preliminary layer PRL1 may be patterned to provide the first insulation layer IL1. On the first insulation layer IL1, first openings OP1 and the through-hole HL-I may be provided. The first openings OP1 may correspond to the first openings OP1-R, OP1-G and OP1-B illustrated in FIG. 7.

Figure 13D:
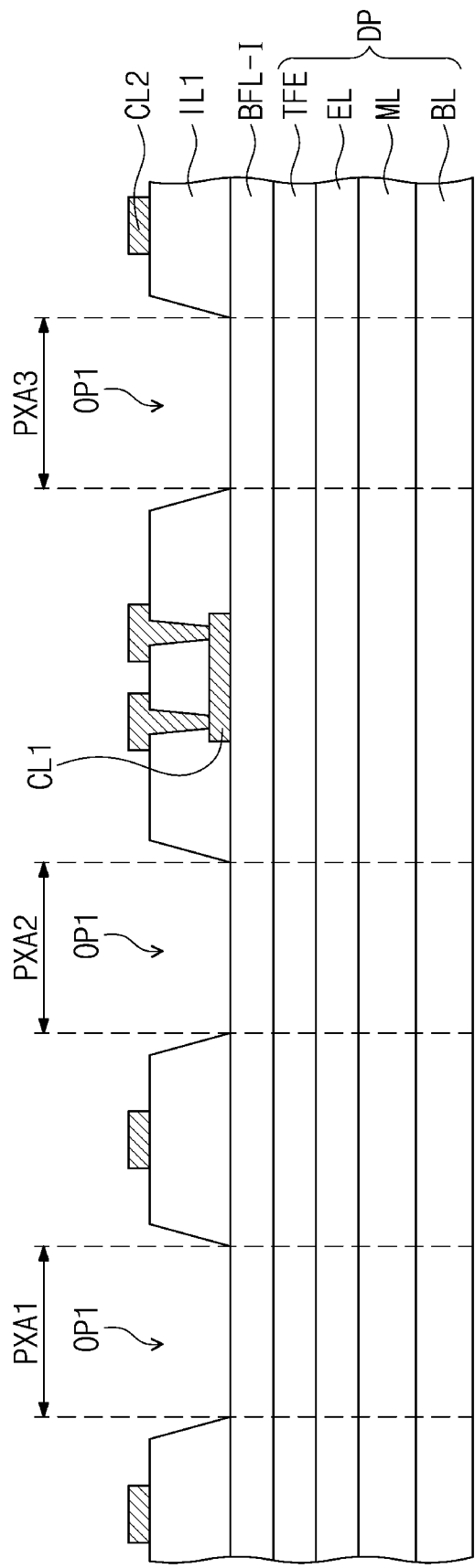

Referring to FIG. 13D, on the first insulation layer IL1, the second conductive layer CL2 is provided.

Figure 13E:
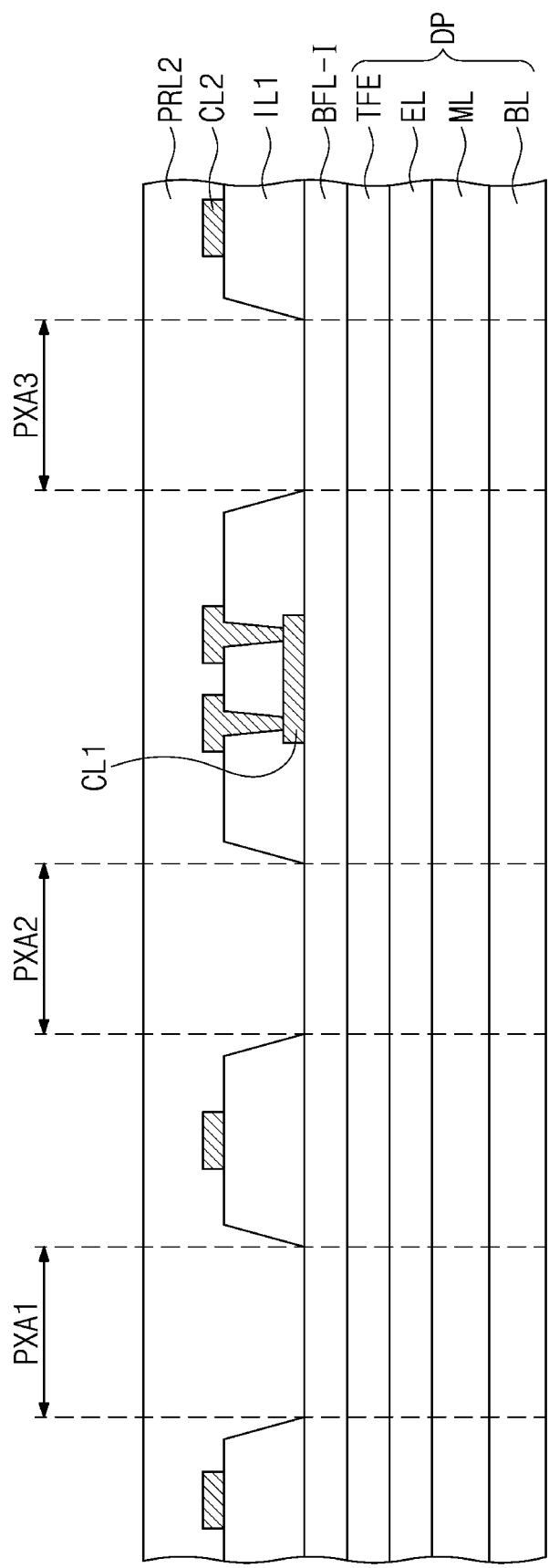

Referring to FIG. 13E, on the second conductive layer CL2, a second preliminary layer PRL2 is provided. The second preliminary layer PRL2 may be a photoresist layer.

Referring to FIG. 13F, the second preliminary layer PRL2 may be patterned to provide the second insulation layer IL2. On the second insulation layer IL2, second openings OP2 may be provided. The second openings OP2 may correspond to the second openings OP2-R, OP2-G and OP2-B illustrated in FIG. 7.

Figure 13G:
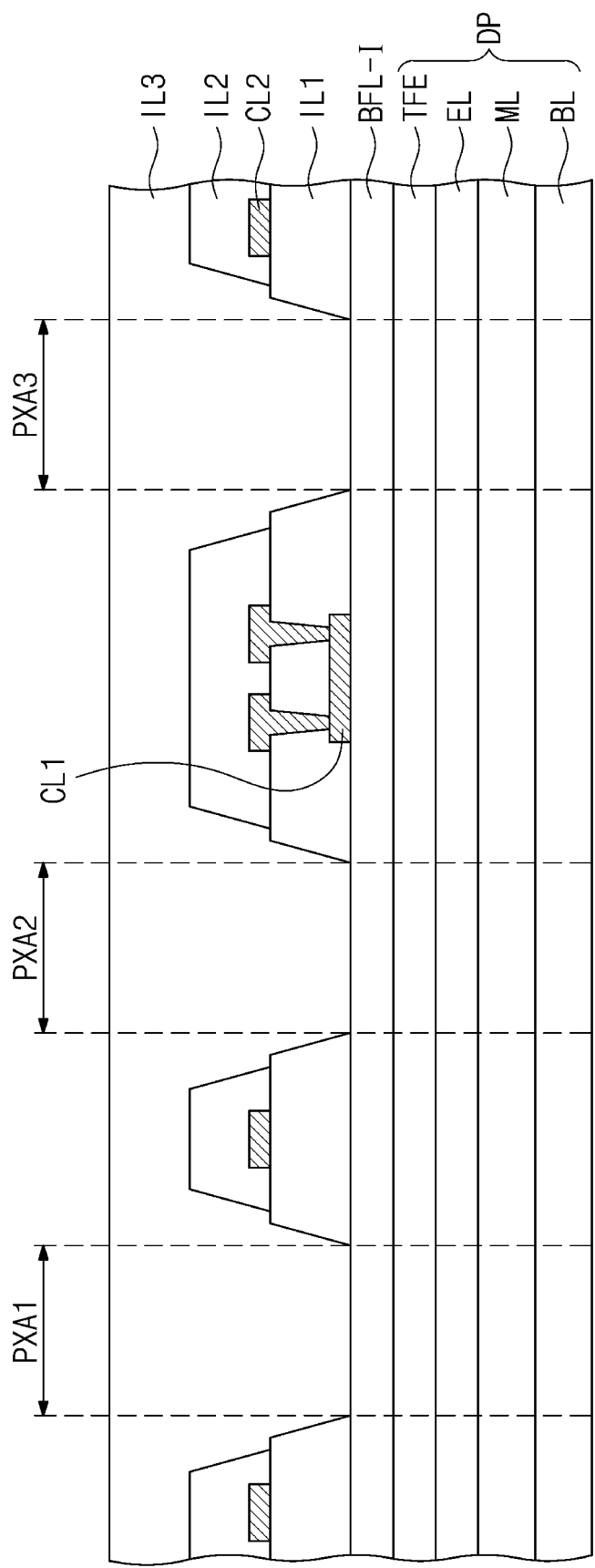

Referring to FIG. 13G on the second insulation layer IL2, the third insulation layer IL3 is provided. The refractive index of the third insulation layer IL3 may be higher than the refractive indexes of the first insulation layer IL1 and the second insulation layer IL2. The third insulation layer IL3 may be filled in the first openings OP1 and the second openings OP2.

Although the present disclosure has been described with reference to preferred embodiments of the present disclosure, it will be understood by those skilled in the art that various modifications and changes in form and details may be made therein without departing from the spirit and scope of the present disclosure as set forth in the following claims. Accordingly, the technical scope of the present disclosure is not intended to be limited to the contents set forth in the detailed description of the disclosure, but is intended to be defined by the appended claims.

INDUSTRIAL APPLICABILITY

The present disclosure which enhances the light efficiency of a display device is highly applicable industrially.

The invention claimed is:
1. A display device comprising:
a display panel including a pixel region; and
an input sensing sensor disposed on the display panel, wherein the input sensing sensor includes:
 a first conductive layer disposed on the display panel;
 a first insulation layer disposed on the display panel, wherein the first insulation layer covers the first conductive layer and has a first opening defined in a region overlapping the pixel region;
 a second conductive layer disposed on the first insulation layer;
 a second insulation layer disposed on the first insulation layer, wherein the second insulation layer covers the second conductive layer and has a second opening defined in the region overlapping the pixel region, wherein the first insulation layer is interposed between the second insulation layer and the display panel; and
 a third insulation layer disposed on the second insulation layer and that completely fills each of the first opening and the second opening, wherein the first opening is fully exposed by the second opening.

2. The display device of claim 1, wherein the first insulation layer has a first refractive index, the second insulation layer has a second refractive index, and the third insulation layer has a third refractive index which is higher than the first refractive index and the second refractive index.

3. The display device of claim 1, wherein an area of the first opening is smaller than an area of the second opening on a plane.

4. The display device of claim 1, wherein an area of the first opening is the same as or larger than an area of the pixel region on a plane.

5. The display device of claim 1, wherein a side surface of the first insulation layer defining the first opening is surrounded by a side surface of the second insulation layer defining the second opening on a plane.

6. The display device of claim 1, wherein the first conductive layer comprises a connecting part and the second conductive layer comprises sensor parts.

7. The display device of claim 6, wherein each of the sensor parts has a mesh shape, each of the sensor parts has a sensor opening defined on a plane, and the sensor opening overlaps the first opening and the second opening.

8. The display device of claim 1, wherein each of a first refractive index of the first insulation layer and a second refractive index of the second insulation layer are each 1.45 to 1.55, and a third refractive index of the third insulation layer is 1.60 to 1.70.

9. The display device of claim 1, wherein the display panel comprises: a base layer; a circuit layer disposed on the base layer; a light emitting layer disposed on the circuit layer; and an encapsulation layer disposed on the light emitting layer, and the input sensing sensor is disposed in direct contact with the encapsulation layer.

10. The display device of claim 9, wherein the input sensing sensor further comprises a buffer layer which is in direct contact with the encapsulation layer, and the buffer layer is disposed between the encapsulation layer and the first conductive layer.

11. A display device comprising:
a display panel including a pixel region;
a first insulation layer disposed on the display panel, having a first refractive index, and having a first opening defined in a region overlapping the pixel region;
a second insulation layer disposed on the first insulation layer, having a second refractive index, and having a second opening bigger than the first opening in a region corresponding to the first opening, and wherein the first insulation layer is interposed between the second insulation layer and the display panel; and
a third insulation layer covering the display panel, the first insulation layer, and the second insulation layer and having a third refractive index higher than the first refractive index and the second refractive index, and the third insulation layer overlaps the pixel region on a plane.

12. The display device of claim 11, further comprising:
a first conductive layer disposed between the display panel and the first insulation layer; and
a second conductive layer disposed between the first insulation layer and the second insulation layer.

13. The display device of claim 12, further comprising a fourth insulation layer disposed between the first insulation layer and the second conductive layer and having a refractive index lower than the third refractive index,
wherein a third opening bigger than the first opening and smaller than the second opening is defined in the fourth insulation layer.

14. The display device of claim 12, wherein the first conductive layer comprises a connecting part and the second conductive layer comprises sensor parts.

15. The display device of claim 14, wherein each of the sensor parts has a mesh shape, and the sensor parts do not overlap the pixel region on a plane.

16. The display device of claim 14, wherein each of the sensor parts has a mesh shape, the sensor parts have a sensor opening defined on a plane, and the sensor opening overlaps the first opening and the second opening.

17. The display device of claim 11, further comprising a fourth insulation layer disposed between the second insulation layer and the third insulation layer and having a refractive index lower than the third refractive index,
wherein a third opening larger than the second opening is defined in the fourth insulation layer.

18. The display device of claim 11, wherein a side surface of the first insulation layer defining the first opening is surrounded by a side surface of the second insulation layer defining the second opening on a plane.

19. The display device of claim 11, wherein the first refractive index and the second refractive index are each 1.45 to 1.55, and the third refractive index is 1.60 to 1.70.

20. The display device of claim 11, wherein the third insulation layer completely fills each of the first opening and the second opening.

* * * * *